US011309351B2

(12) United States Patent
Iguchi et al.

(10) Patent No.: US 11,309,351 B2
(45) Date of Patent: Apr. 19, 2022

(54) MICRO LIGHT-EMITTING DIODE AND MANUFACTURING METHOD OF MICRO LIGHT-EMITTING DIODE

(71) Applicant: SHARP KABUSHIKI KAISHA, Sakai (JP)

(72) Inventors: Katsuji Iguchi, Sakai (JP); Hidenori Kawanishi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 136 days.

(21) Appl. No.: 16/792,557

(22) Filed: Feb. 17, 2020

(65) Prior Publication Data

US 2020/0266233 A1   Aug. 20, 2020

Related U.S. Application Data

(60) Provisional application No. 62/808,097, filed on Feb. 20, 2019.

(51) Int. Cl.
| | |
|---|---|
| H01L 33/00 | (2010.01) |
| H01L 27/15 | (2006.01) |
| H01L 33/06 | (2010.01) |
| H01L 33/38 | (2010.01) |
| H01L 33/32 | (2010.01) |

(52) U.S. Cl.
CPC .......... *H01L 27/156* (2013.01); *H01L 33/007* (2013.01); *H01L 33/06* (2013.01); *H01L 33/32* (2013.01); *H01L 33/38* (2013.01); *H01L 2933/0016* (2013.01)

(58) Field of Classification Search
None
See application file for complete search history.

(56) References Cited

U.S. PATENT DOCUMENTS

| | | | |
|---|---|---|---|
| 8,409,897 B2 * | 4/2013 | Nishikawa | .......... H01L 21/0262 |
| | | | 438/46 |
| 2012/0077299 A1 | 3/2012 | Nishikawa et al. | |
| 2017/0069609 A1 | 3/2017 | Zhang et al. | |
| 2021/0249394 A1* | 8/2021 | Ikeda | ................... G09G 3/3233 |

FOREIGN PATENT DOCUMENTS

| | | |
|---|---|---|
| JP | 2009-212308 A | 9/2009 |
| WO | 2010/128643 A1 | 11/2010 |

* cited by examiner

*Primary Examiner* — Bradley Smith
(74) *Attorney, Agent, or Firm* — ScienBiziP, P.C.

(57) ABSTRACT

A micro light-emitting diode includes a first micro light-emitting diode including a first light-emitting layer and emitting light at a first wavelength, and a second micro light-emitting diode including the first light-emitting layer and a second light-emitting layer emitting light at a second wavelength longer than the first wavelength, in which the second light-emitting layer is a nitride semiconductor layer doped with a second rare earth element, and a nitride semiconductor of the first micro light-emitting diode and the nitride semiconductor of the second micro light-emitting diode are separated from each other.

8 Claims, 23 Drawing Sheets

FIG. 2A
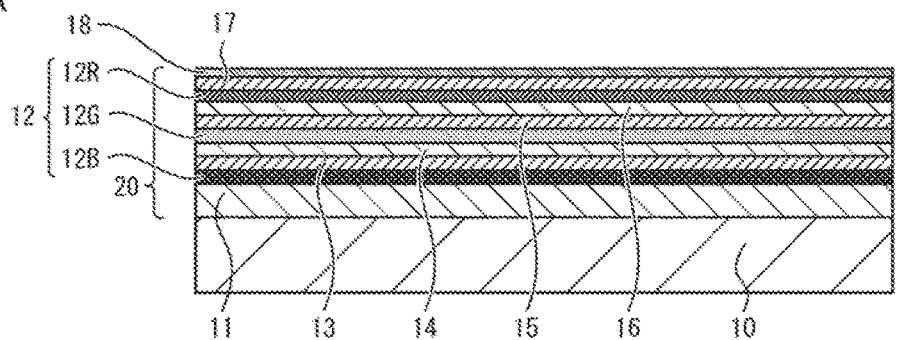

FIG. 2B
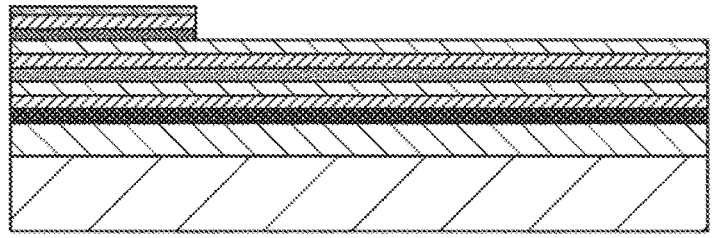

FIG. 2C
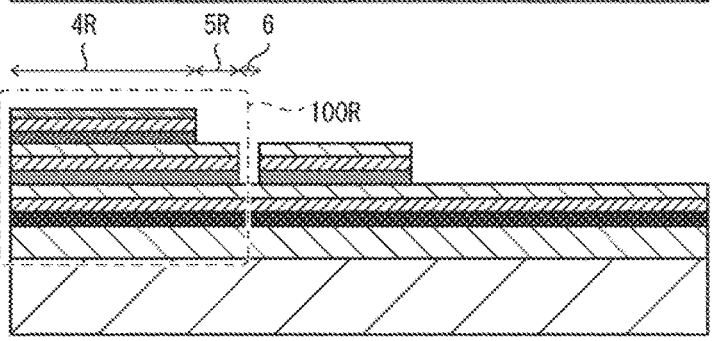

FIG. 2D
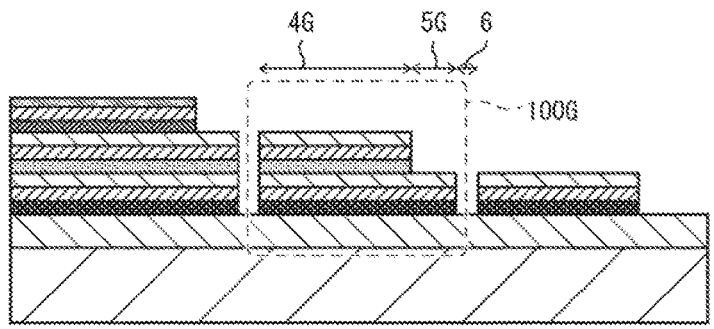

| | | |
|---|---|---|
| 4G: GREEN LIGHT-EMITTING REGION | 12B: BLUE LIGHT-EMITTING LAYER | 17: THIRD P-SIDE LAYER |
| 4R: RED LIGHT-EMITTING REGION | 12G: GREEN LIGHT-EMITTING LAYER | 18: P-ELECTRODE LAYER |
| 5G, 5R: N-SIDE LAYER CONTACT REGION | 12R: RED LIGHT-EMITTING LAYER | 20: NITRIDE SEMICONDUCTOR LAYER |
| 6: MICRO LED SEPARATION REGION | 13: FIRST P-SIDE LAYER | 100G: GREEN LIGHT-EMITTING MICRO LED |
| 10: GROWTH SUBSTRATE | 14: SECOND N-SIDE LAYER | 100R: RED LIGHT-EMITTING MICRO LED |
| 11: FIRST N-SIDE LAYER | 15: SECOND P-SIDE LAYER | |
| 12: LIGHT-EMITTING LAYER | 16: THIRD N-SIDE LAYER | |

FIG. 3A

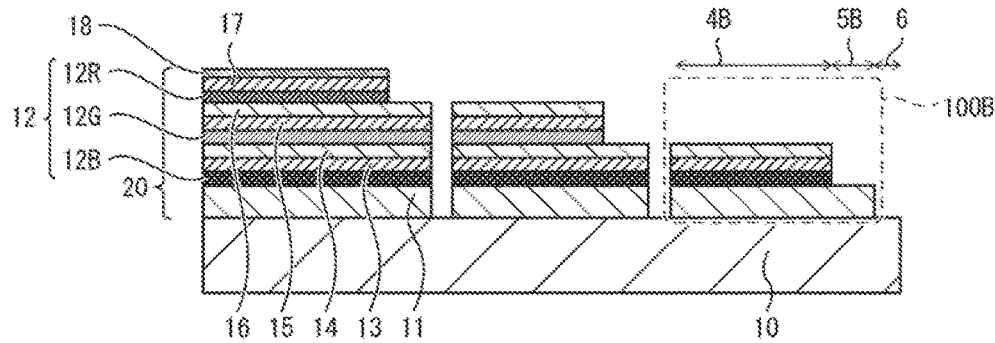

FIG. 3B

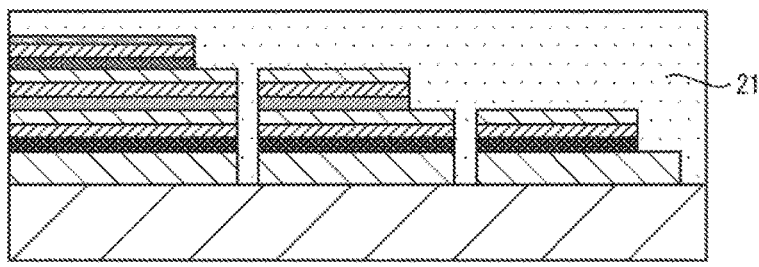

FIG. 3C

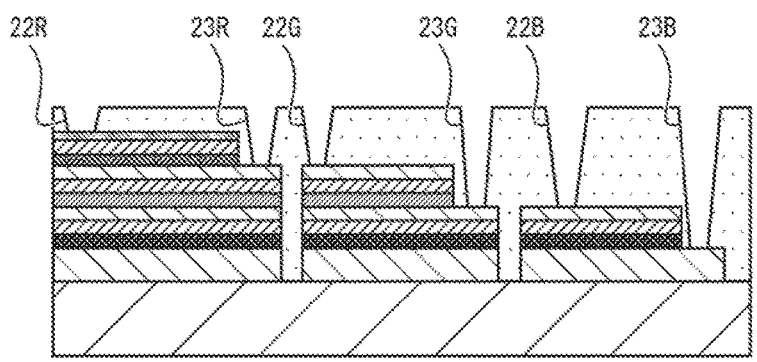

| | | |
|---|---|---|
| 4B: BLUE LIGHT-EMITTING REGION | 13: FIRST P-SIDE LAYER | 23B, 23G, 23R: N-CONTACT HOLE |
| 5B: N-SIDE LAYER CONTACT REGION | 14: SECOND N-SIDE LAYER | 100B: BLUE LIGHT-EMITTING MICRO LED |
| 6: MICRO LED SEPARATION REGION | 15: SECOND P-SIDE LAYER | |
| 10: GROWTH SUBSTRATE | 16: THIRD N-SIDE LAYER | |
| 11: FIRST N-SIDE LAYER | 17: THIRD P-SIDE LAYER | |
| 12: LIGHT-EMITTING LAYER | 18: P-ELECTRODE LAYER | |
| 12B: BLUE LIGHT-EMITTING LAYER | 20: NITRIDE SEMICONDUCTOR LAYER | |
| 12G: GREEN LIGHT-EMITTING LAYER | 21: PROTECTION FILM | |
| 12R: RED LIGHT-EMITTING LAYER | 22B, 22G, 22R: P-CONTACT HOLE | |

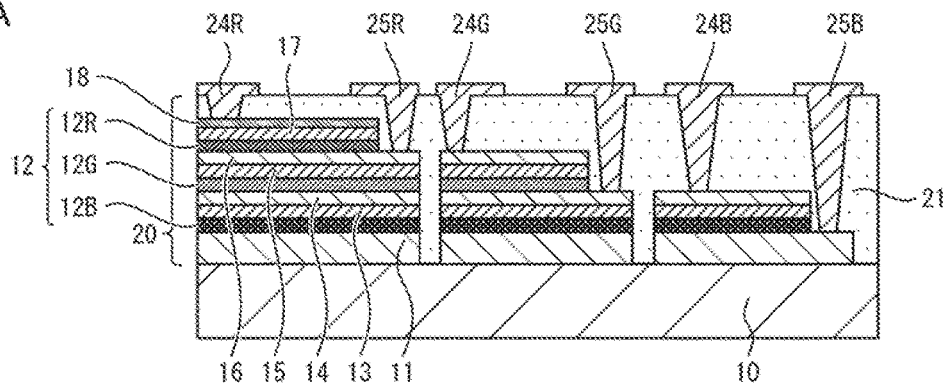
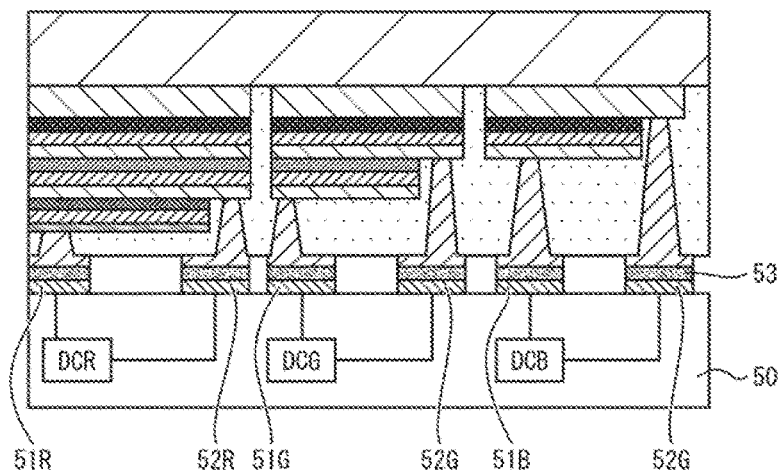
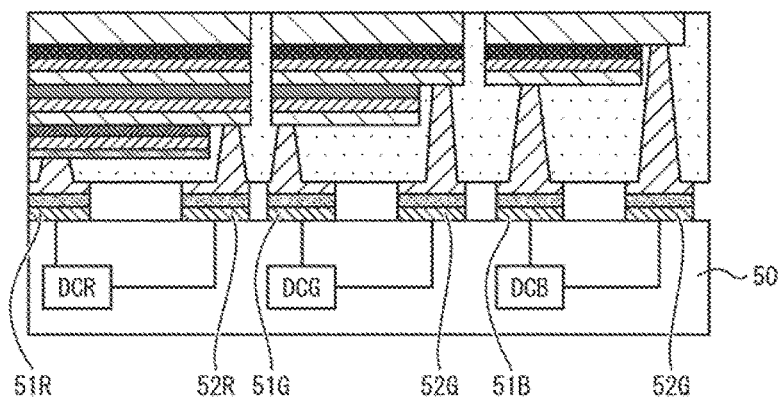

FIG. 5A

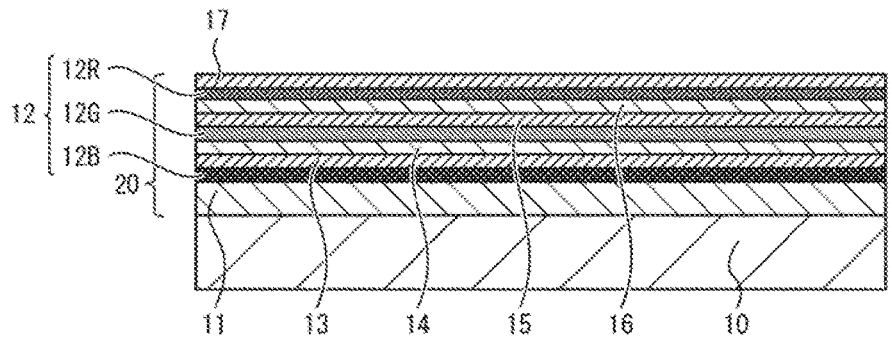

FIG. 5B

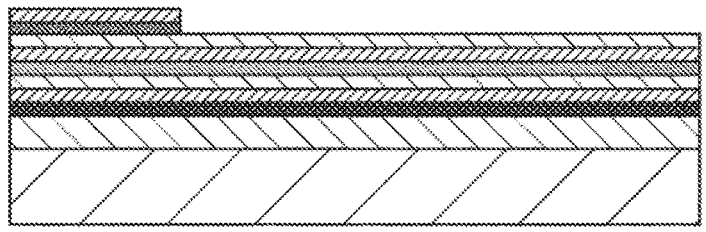

FIG. 5C

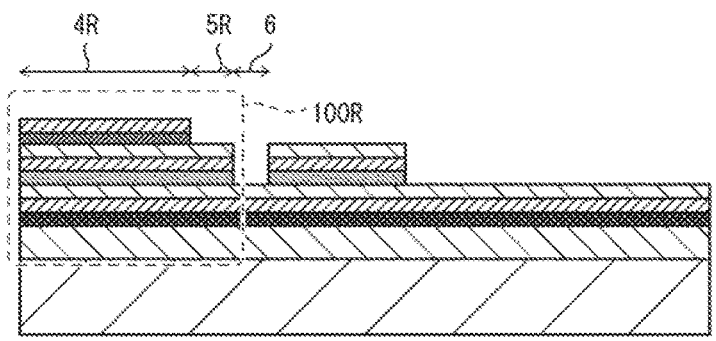

FIG. 5D

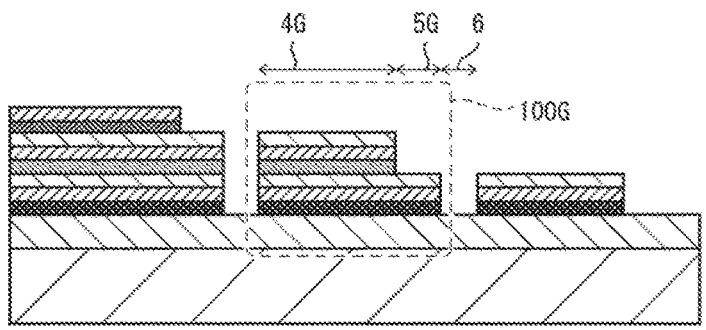

| | | |
|---|---|---|
| 4G: GREEN LIGHT-EMITTING REGION | 12B: BLUE LIGHT-EMITTING LAYER | 17: THIRD P-SIDE LAYER |
| 4R: RED LIGHT-EMITTING REGION | 12G: GREEN LIGHT-EMITTING LAYER | 20: NITRIDE SEMICONDUCTOR LAYER |
| 5G, 5R: N-SIDE LAYER CONTACT REGION | 12R: RED LIGHT-EMITTING LAYER | 100G: GREEN LIGHT-EMITTING MICRO LED |
| 6: MICRO LED SEPARATION REGION | 13: FIRST P-SIDE LAYER | 100R: RED LIGHT-EMITTING MICRO LED |
| 10: GROWTH SUBSTRATE | 14: SECOND N-SIDE LAYER | |
| 11: FIRST N-SIDE LAYER | 15: SECOND P-SIDE LAYER | |
| 12: LIGHT-EMITTING LAYER | 16: THIRD N-SIDE LAYER | |

FIG. 6A

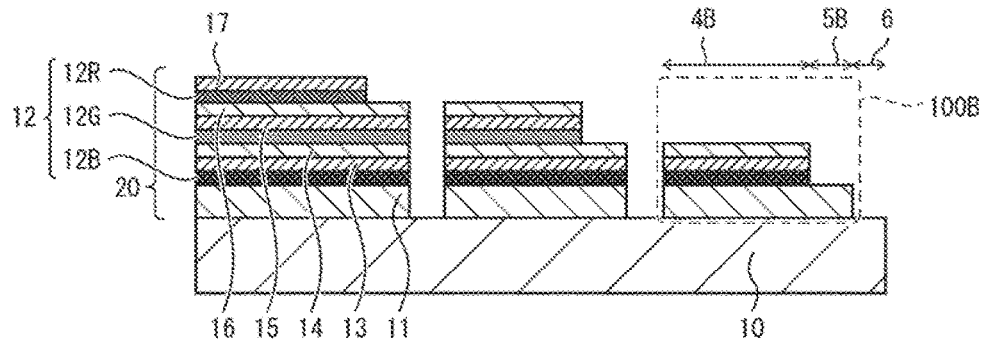

FIG. 6B

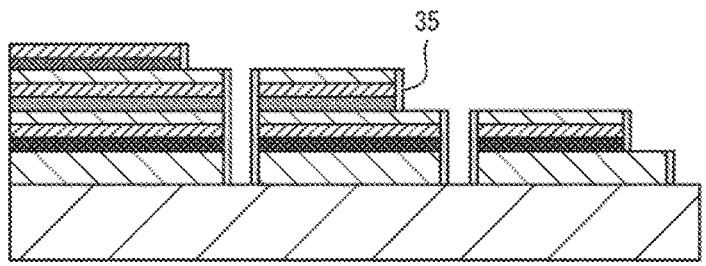

FIG. 6C

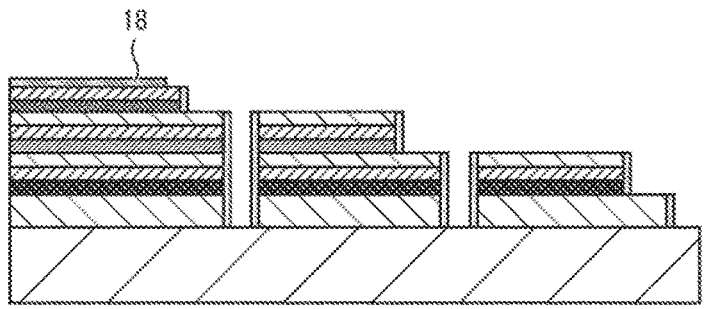

| | |
|---|---|
| 4B: BLUE LIGHT-EMITTING REGION | 13: FIRST P-SIDE LAYER |
| 5B: N-SIDE LAYER CONTACT REGION | 14: SECOND N-SIDE LAYER |
| 6: MICRO LED SEPARATION REGION | 15: SECOND P-SIDE LAYER |
| 10: GROWTH SUBSTRATE | 16: THIRD N-SIDE LAYER |
| 11: FIRST N-SIDE LAYER | 17: THIRD P-SIDE LAYER |
| 12: LIGHT-EMITTING LAYER | 18: P-ELECTRODE LAYER |
| 12B: BLUE LIGHT-EMITTING LAYER | 20: NITRIDE SEMICONDUCTOR LAYER |
| 12G: GREEN LIGHT-EMITTING LAYER | 35: SIDE WALL HIGH-RESISTANCE LAYER |
| 12R: RED LIGHT-EMITTING LAYER | 100B: BLUE LIGHT-EMITTING MICRO LED |

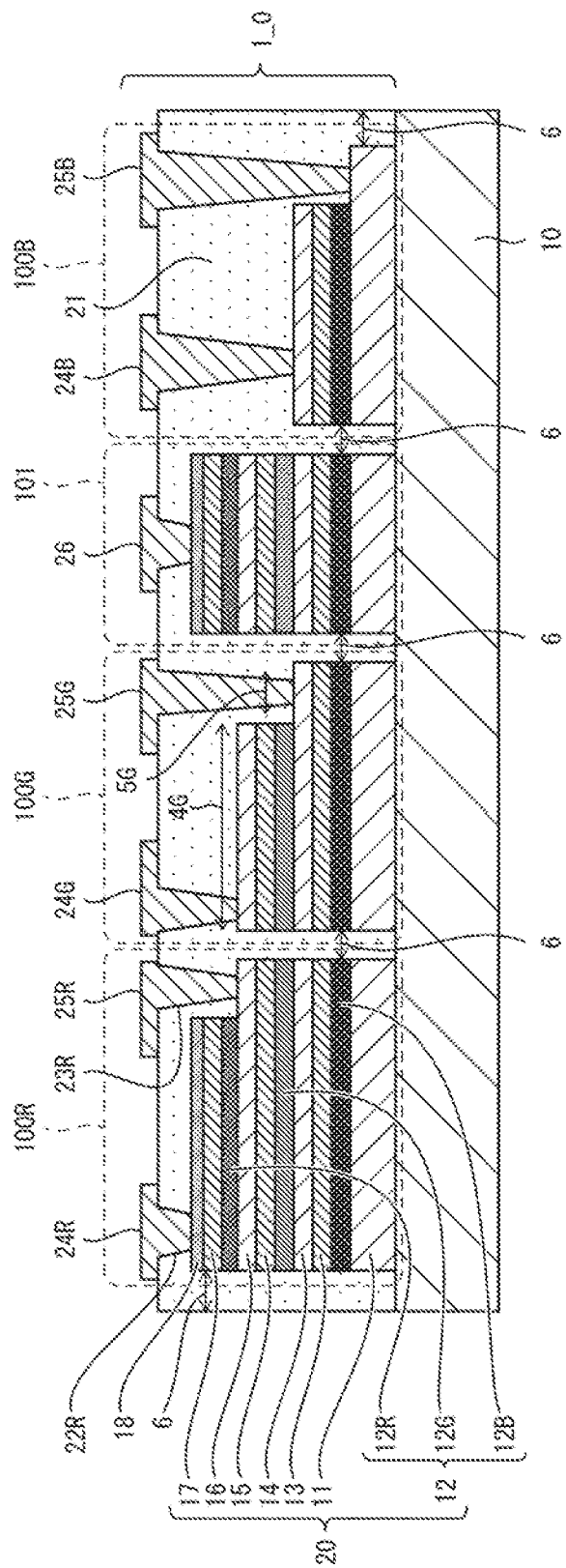

FIG. 9A

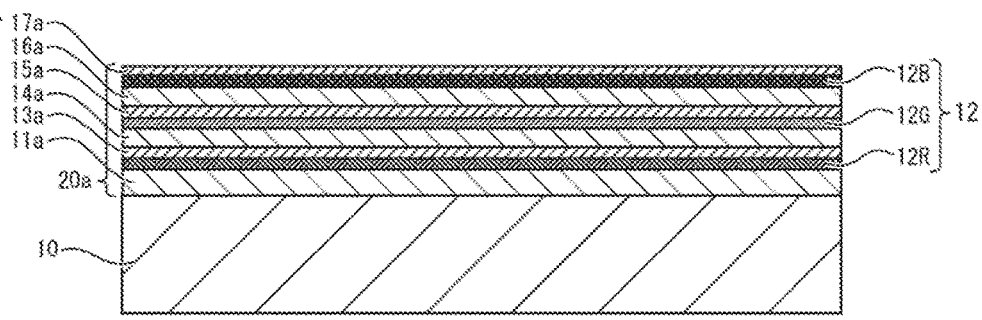

FIG. 9B

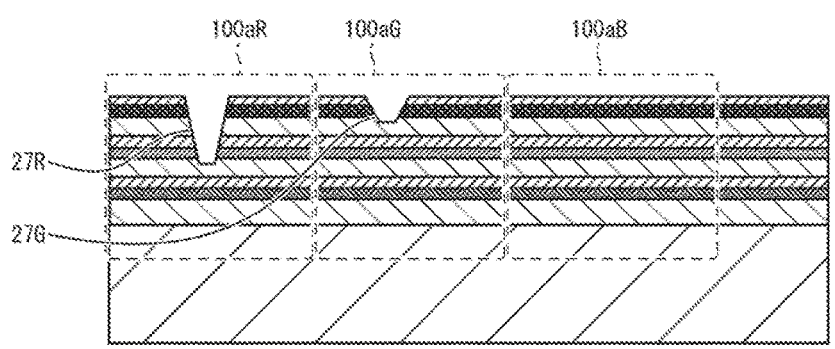

FIG. 9C

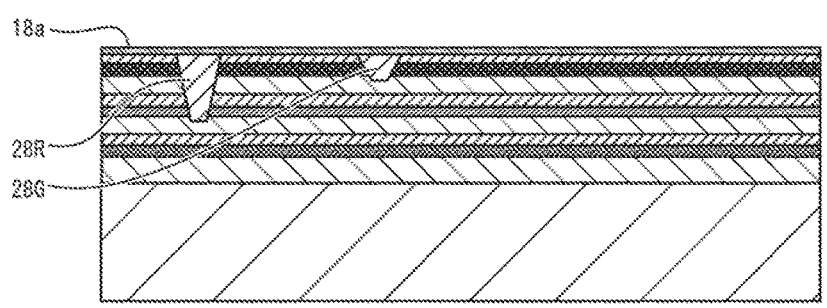

| | | |
|---|---|---|
| 10: GROWTH SUBSTRATE | 15a: SECOND P-SIDE LAYER | 100aG: GREEN LIGHT-EMITTING MICRO LED |
| 11a: FIRST N-SIDE LAYER | 16a: THIRD N-SIDE LAYER | 100aR: RED LIGHT-EMITTING MICRO LED |
| 12: LIGHT-EMITTING LAYER | 17a: THIRD P-SIDE LAYER | |
| 12B: BLUE LIGHT-EMITTING LAYER | 18a: P-ELECTRODE LAYER | |
| 12G: GREEN LIGHT-EMITTING LAYER | 20a: NITRIDE SEMICONDUCTOR LAYER | |
| 12R: RED LIGHT-EMITTING LAYER | 27G, 27R: P-INTERNAL CONTACT HOLE | |
| 13a: FIRST P-SIDE LAYER | 28G, 28R: INTERNAL WIRING | |
| 14a: SECOND N-SIDE LAYER | 100aB: BLUE LIGHT-EMITTING MICRO LED | |

FIG. 10A

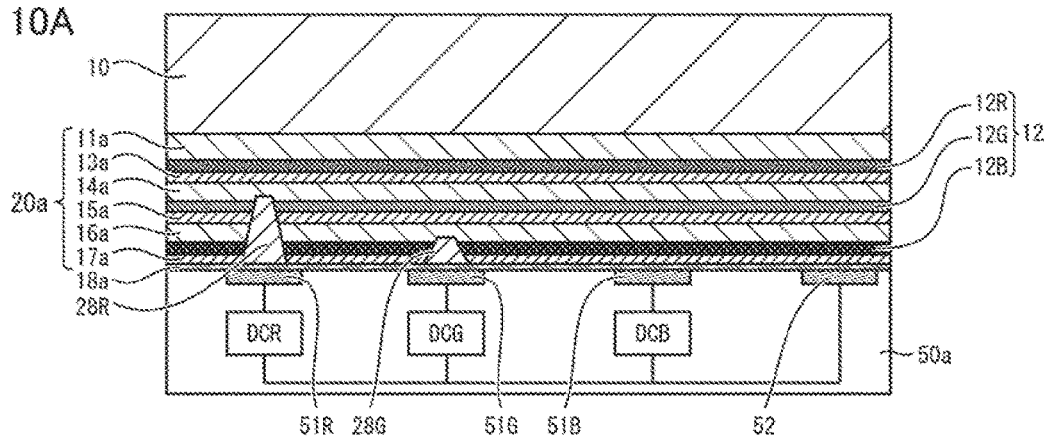

FIG. 10B

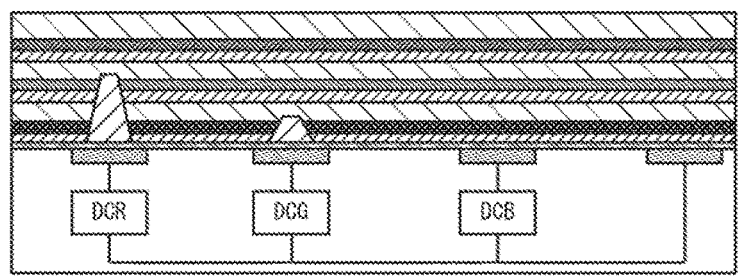

FIG. 10C

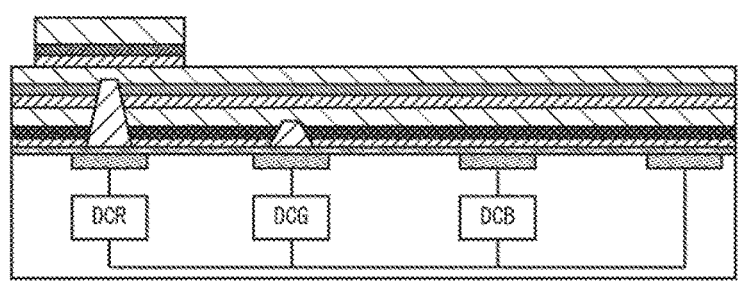

FIG. 10D

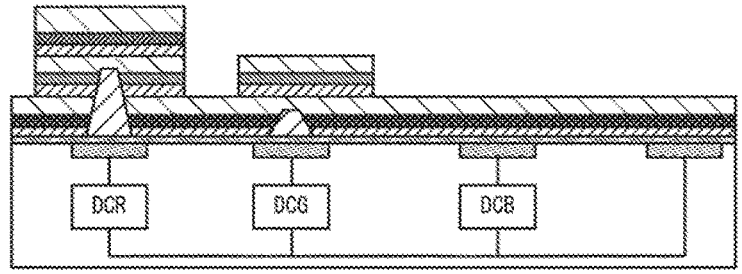

10: GROWTH SUBSTRATE
11a: FIRST N-SIDE LAYER
12: LIGHT-EMITTING LAYER
12B: BLUE LIGHT-EMITTING LAYER
12G: GREEN LIGHT-EMITTING LAYER
12R: RED LIGHT-EMITTING LAYER
13a: FIRST P-SIDE LAYER
14a: SECOND N-SIDE LAYER
15a: SECOND P-SIDE LAYER
16a: THIRD N-SIDE LAYER
17a: THIRD P-SIDE LAYER
18a: P-ELECTRODE LAYER
20a: NITRIDE SEMICONDUCTOR LAYER
28G, 28R: INTERNAL WIRING
50a: DRIVE CIRCUIT SUBSTRATE
51B, 51G, 51R: P-SIDE ELECTRODE
52: N-SIDE ELECTRODE
DCR: RED MICRO LED DRIVE CIRCUIT
DCG: GREEN MICRO LED DRIVE CIRCUIT
DCB: BLUE MICRO LED DRIVE CIRCUIT

FIG. 11A
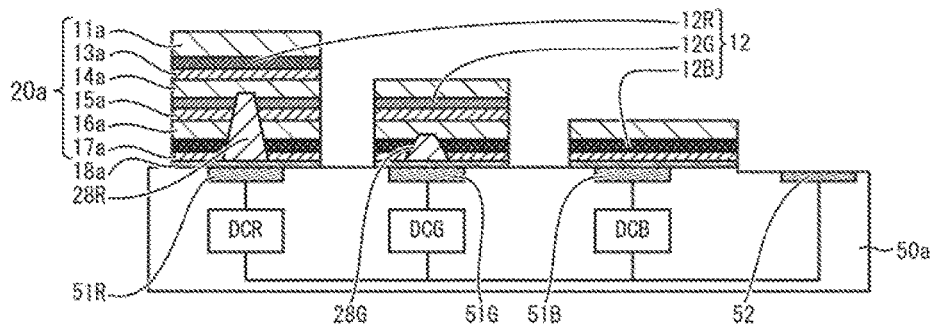

FIG. 11B
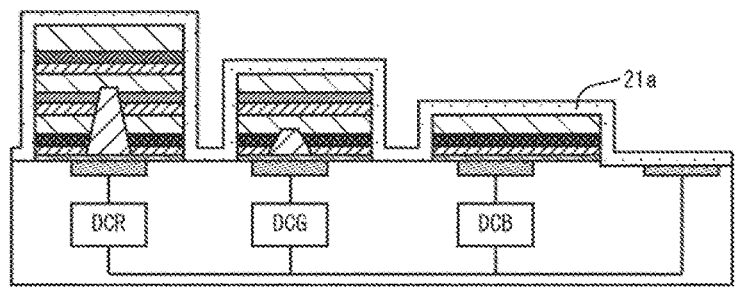

FIG. 11C
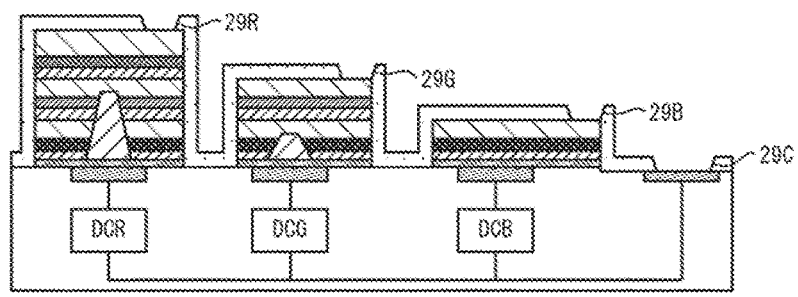

FIG. 11D
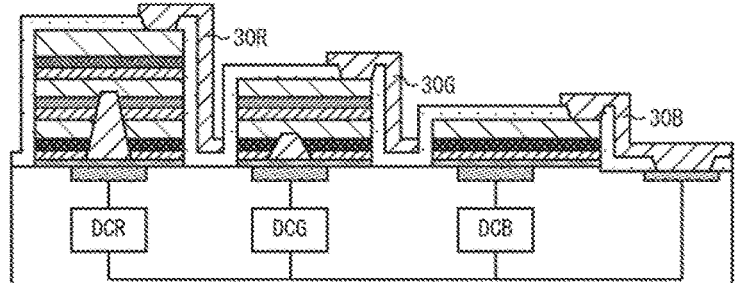

| | |
|---|---|
| 11a: FIRST N-SIDE LAYER | 20a: NITRIDE SEMICONDUCTOR LAYER |
| 12: LIGHT-EMITTING LAYER | 21a: PROTECTION FILM |
| 12B: BLUE LIGHT-EMITTING LAYER | 28G, 28R: INTERNAL WIRING |
| 12G: GREEN LIGHT-EMITTING LAYER | 29B, 29C, 29G, 29R: N-CONTACT HOLE |
| 12R: RED LIGHT-EMITTING LAYER | 30B, 30G, 30R: N-WIRING |
| 13a: FIRST P-SIDE LAYER | 50a: DRIVE CIRCUIT SUBSTRATE |
| 14a: SECOND N-SIDE LAYER | 51B, 51G, 51R: P-SIDE ELECTRODE |
| 15a: SECOND P-SIDE LAYER | 52: N-SIDE ELECTRODE |
| 16a: THIRD N-SIDE LAYER | DCR: RED MICRO LED DRIVE CIRCUIT |
| 17a: THIRD P-SIDE LAYER | DCG: GREEN MICRO LED DRIVE CIRCUIT |
| 18a: P-ELECTRODE LAYER | DCB: BLUE MICRO LED DRIVE CIRCUIT |

FIG. 13A
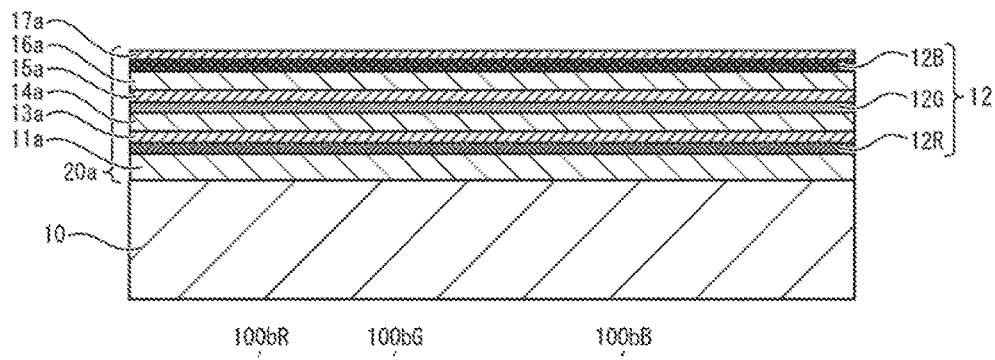

FIG. 13B
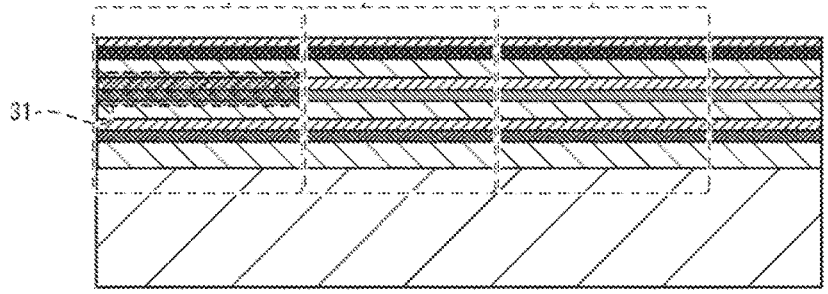

FIG. 13C
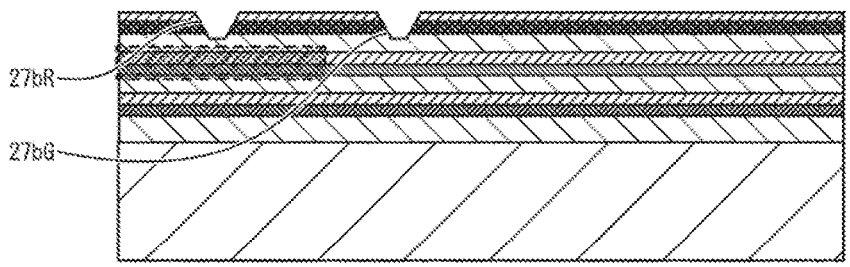

FIG. 13D
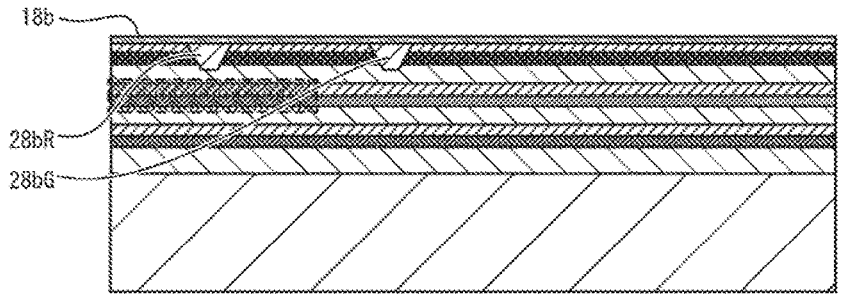

10: GROWTH SUBSTRATE
11a: FIRST N-SIDE LAYER
12: LIGHT-EMITTING LAYER
12B: BLUE LIGHT-EMITTING LAYER
12G: GREEN LIGHT-EMITTING LAYER
12R: RED LIGHT-EMITTING LAYER
13a: FIRST P-SIDE LAYER
14a: SECOND N-SIDE LAYER
15a: SECOND P-SIDE LAYER
16a: THIRD N-SIDE LAYER
17a: THIRD P-SIDE LAYER
18b: P-ELECTRODE LAYER
20a: NITRIDE SEMICONDUCTOR LAYER
27bG, 27bR: P-INTERNAL CONTACT HOLE
28bG, 28bR: INTERNAL WIRING
31: ION IMPLANTATION
100bB: BLUE LIGHT-EMITTING MICRO LED
100bG: GREEN LIGHT-EMITTING MICRO LED
100bR: RED LIGHT-EMITTING MICRO LED

FIG. 14A

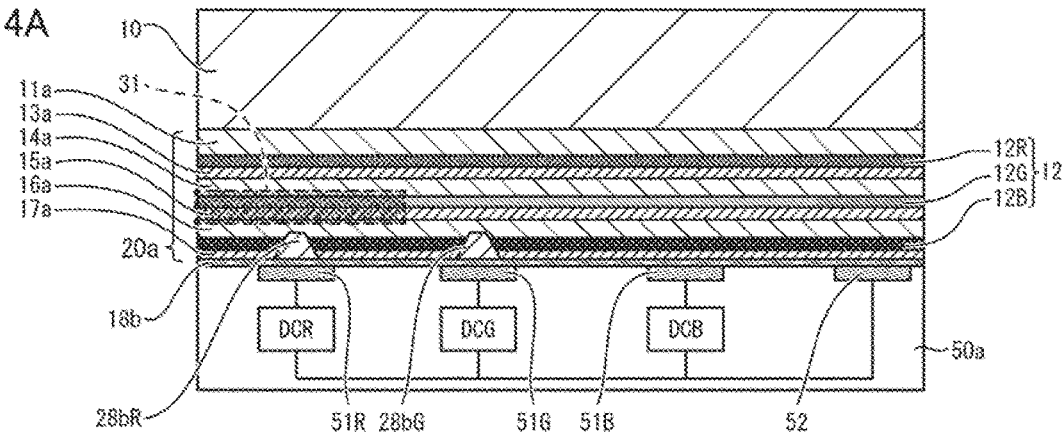

FIG. 14B

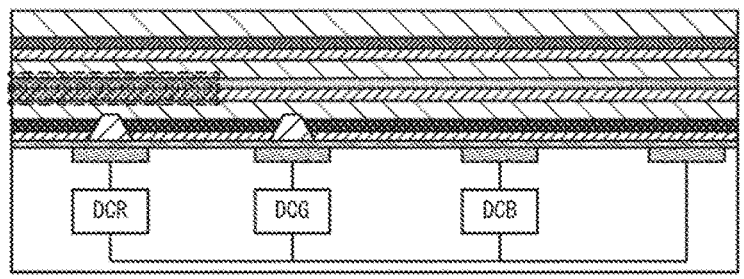

FIG. 14C

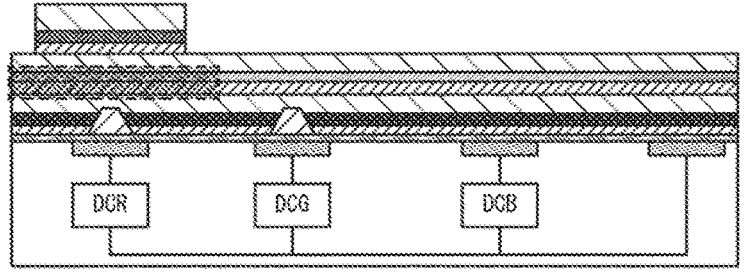

FIG. 14D

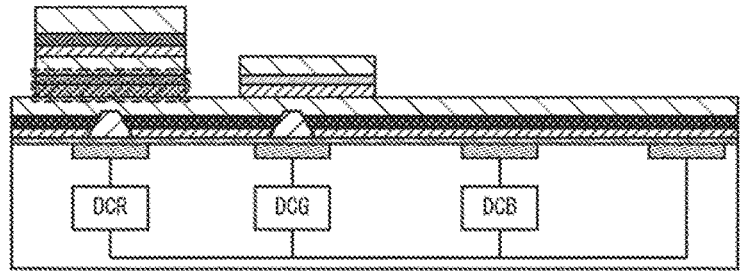

| 10:GROWTH SUBSTRATE | 15a:SECOND P-SIDE LAYER | 51B,51G,51R:P-SIDE ELECTRODE |
| 11a:FIRST N-SIDE LAYER | 16a:THIRD N-SIDE LAYER | 52:N-SIDE ELECTRODE |
| 12:LIGHT-EMITTING LAYER | 17a:THIRD P-SIDE LAYER | DCR:RED MICRO LED DRIVE CIRCUIT |
| 12B:BLUE LIGHT-EMITTING LAYER | 18b:P-ELECTRODE LAYER | DCG:GREEN MICRO LED DRIVE CIRCUIT |
| 12G:GREEN LIGHT-EMITTING LAYER | 20a:NITRIDE SEMICONDUCTOR LAYER | DCB:BLUE MICRO LED DRIVE CIRCUIT |
| 12R:RED LIGHT-EMITTING LAYER | 28bG,28bR:INTERNAL WIRING | |
| 13a:FIRST P-SIDE LAYER | 31:ION IMPLANTATION | |
| 14a:SECOND N-SIDE LAYER | 50a:DRIVE CIRCUIT SUBSTRATE | |

FIG. 15A 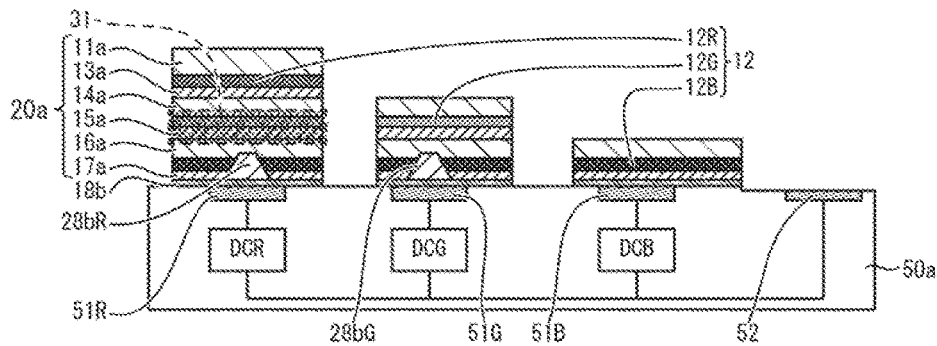

FIG. 15B 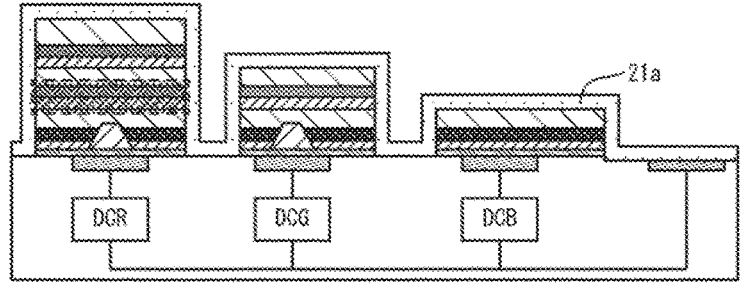

FIG. 15C 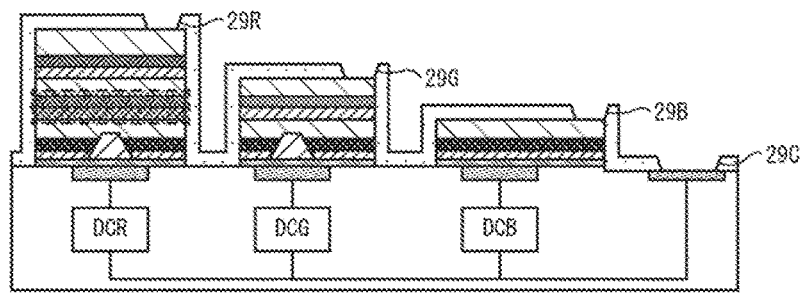

FIG. 15D 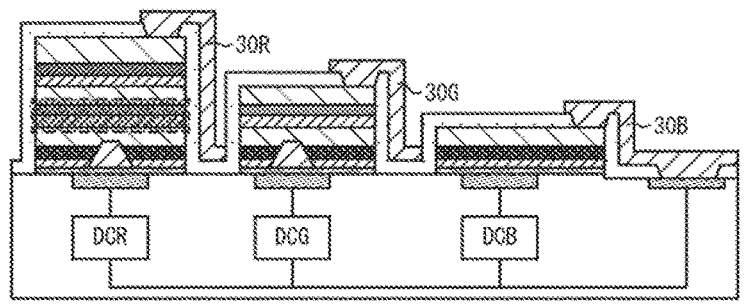

| | |
|---|---|
| 11a: FIRST N-SIDE LAYER | 20a: NITRIDE SEMICONDUCTOR LAYER |
| 12: LIGHT-EMITTING LAYER | 21a: PROTECTION FILM |
| 12B: BLUE LIGHT-EMITTING LAYER | 28bG, 28bR: INTERNAL WIRING |
| 12G: GREEN LIGHT-EMITTING LAYER | 29B, 29C, 29G, 29R: N-CONTACT HOLE |
| 12R: RED LIGHT-EMITTING LAYER | 30B, 30G, 30R: N-WIRING |
| 13a: FIRST P-SIDE LAYER | 50a: DRIVE CIRCUIT SUBSTRATE |
| 14a: SECOND N-SIDE LAYER | 51B, 51G, 51R: P-SIDE ELECTRODE |
| 15a: SECOND P-SIDE LAYER | 52: N-SIDE ELECTRODE |
| 16a: THIRD N-SIDE LAYER | DCR: RED MICRO LED DRIVE CIRCUIT |
| 17a: THIRD P-SIDE LAYER | DCG: GREEN MICRO LED DRIVE CIRCUIT |
| 18b: P-ELECTRODE LAYER | DCB: BLUE MICRO LED DRIVE CIRCUIT |

```
10:GROWTH SUBSTRATE              16c:THIRD N-SIDE LAYER
11c:FIRST N-SIDE LAYER           17c:THIRD P-SIDE LAYER
12:LIGHT-EMITTING LAYER          20c:NITRIDE SEMICONDUCTOR LAYER
12B:BLUE LIGHT-EMITTING LAYER    100cB:BLUE LIGHT-EMITTING MICRO LED
12G:GREEN LIGHT-EMITTING LAYER   100cG:GREEN LIGHT-EMITTING MICRO LED
12R:RED LIGHT-EMITTING LAYER     100cR:RED LIGHT-EMITTING MICRO LED
14c:SECOND N-SIDE LAYER
```

4G: GREEN LIGHT-EMITTING REGION
5G: N-SIDE LAYER CONTACT REGION
6: MICRO LED SEPARATION REGION
10: GROWTH SUBSTRATE
11c: FIRST N-SIDE LAYER
12: LIGHT-EMITTING LAYER
12B: BLUE LIGHT-EMITTING LAYER
12G: GREEN LIGHT-EMITTING LAYER
12R: RED LIGHT-EMITTING LAYER
14c: SECOND N-SIDE LAYER
16c: THIRD N-SIDE LAYER
17c: THIRD P-SIDE LAYER
18: P-ELECTRODE LAYER
20c: NITRIDE SEMICONDUCTOR LAYER

| | |
|---|---|
| 10: GROWTH SUBSTRATE | 18: P-ELECTRODE LAYER |
| 11c: FIRST N-SIDE LAYER | 20c: NITRIDE SEMICONDUCTOR LAYER |
| 12: LIGHT-EMITTING LAYER | 21: PROTECTION FILM |
| 12B: BLUE LIGHT-EMITTING LAYER | 22B, 22G, 22R: P-CONTACT HOLE |
| 12G: GREEN LIGHT-EMITTING LAYER | 23B, 23G, 23R: N-CONTACT HOLE |
| 12R: RED LIGHT-EMITTING LAYER | 24B, 24G, 24R: P-ELECTRODE |
| 14c: SECOND N-SIDE LAYER | 25B, 25G, 25R: N-ELECTRODE |
| 16c: THIRD N-SIDE LAYER | |
| 17c: THIRD P-SIDE LAYER | |

FIG. 20

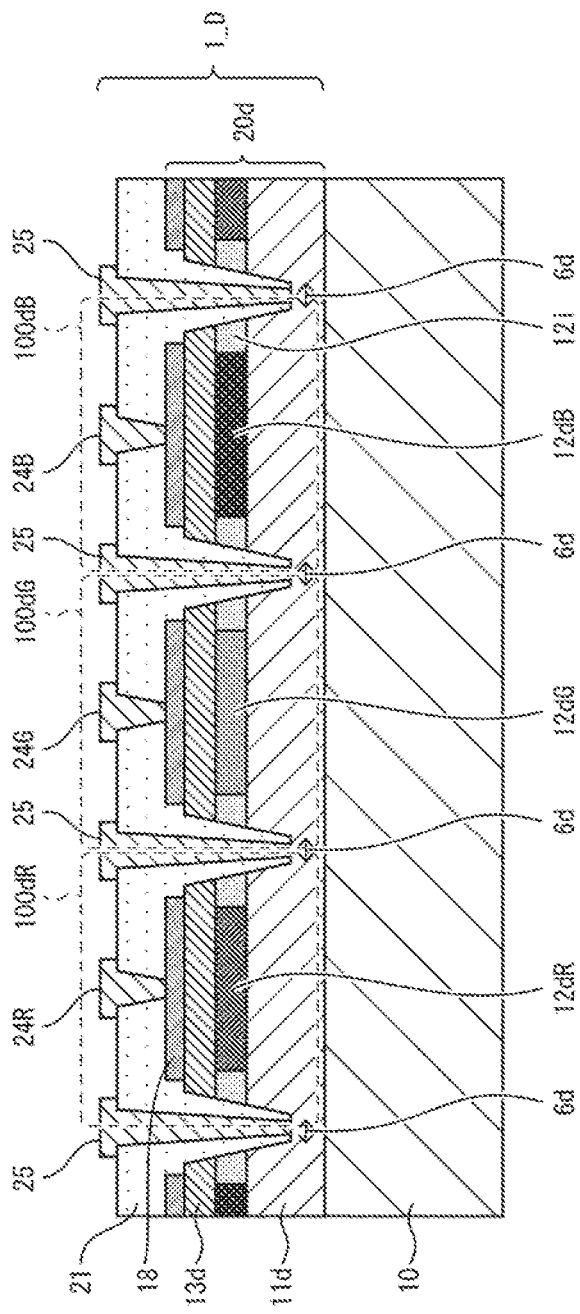

- 1_D: MICRO LED
- 6d: MICRO LED SEPARATION REGION
- 10: GROWTH SUBSTRATE
- 11d: FIRST N-SIDE LAYER
- 12dB: BLUE LIGHT-EMITTING LAYER
- 12dG: GREEN LIGHT-EMITTING LAYER
- 12dR: RED LIGHT-EMITTING LAYER
- 121: HIGH-RESISTANCE LAYER
- 13d: FIRST P-SIDE LAYER
- 18: P-ELECTRODE LAYER
- 20d: NITRIDE SEMICONDUCTOR LAYER
- 21: PROTECTION FILM
- 24B, 24G, 24R: P-ELECTRODE
- 25: N-ELECTRODE
- 100dB: BLUE LIGHT-EMITTING MICRO LED
- 100dG: GREEN LIGHT-EMITTING MICRO LED
- 100dR: RED LIGHT-EMITTING MICRO LED

10: GROWTH SUBSTRATE
11d: FIRST N-SIDE LAYER
12i: HIGH-RESISTANCE LAYER
13d: FIRST P-SIDE LAYER
20d: NITRIDE SEMICONDUCTOR LAYER
32R: RESIST PATTER
Eu: ION IMPLANTATION

6d: MICRO LED SEPARATION REGION
10: GROWTH SUBSTRATE
11d: FIRST N-SIDE LAYER
12dB: BLUE LIGHT-EMITTING LAYER
12dG: GREEN LIGHT-EMITTING LAYER
12dR: RED LIGHT-EMITTING LAYER
12i: HIGH-RESISTANCE LAYER
13d: FIRST P-SIDE LAYER
18: P-ELECTRODE LAYER
20d: NITRIDE SEMICONDUCTOR LAYER
33: SEPARATION GROOVE

10: GROWTH SUBSTRATE
11d: FIRST N-SIDE LAYER
12dB: BLUE LIGHT-EMITTING LAYER
12dG: GREEN LIGHT-EMITTING LAYER
12dR: RED LIGHT-EMITTING LAYER
12i: HIGH-RESISTANCE LAYER
13d: FIRST P-SIDE LAYER
18: P-ELECTRODE LAYER
20d: NITRIDE SEMICONDUCTOR LAYER

21d: PROTECTION FILM
22dB, 22dG, 22dR: P-INTERNAL CONTACT HOLE
23d: N-CONTACT HOLE
24B, 24G, 24R: P-ELECTRODE
25: N-ELECTRODE

MICRO LIGHT-EMITTING DIODE AND MANUFACTURING METHOD OF MICRO LIGHT-EMITTING DIODE

BACKGROUND

1. Field

The present disclosure relates to a structure of a micro light-emitting diode and a manufacturing method thereof.

2. Description of the Related Art

In recent years, a color display using a micro LED (micro light-emitting diode) as a light source has been proposed. By using blue light-emitting and green light-emitting micro LEDs made of a nitride semiconductor and a red light-emitting micro LED made of AlInGaP, a full color display with a wide color gamut can be realized.

In a micro display using the micro LED, a method in which a display element using a light-emitting material different for each color as described above is used (three-panel type) and light emission images of three display elements are optically superimposed to perform full color display has been proposed.

In US Patent Application Publication No. US2017-0069609 (published on Mar. 9, 2017), a single-panel type micro display that realizes full color display with one display element is disclosed. In the single-panel type micro display that realizes full color display with one display element, a full color display can be realized by a method of realizing full color display by converting blue light emission into green light or red light using a wavelength conversion material such as a quantum dot, or by bonding different light-emitting bodies.

On the other hand, in International Publication No. WO2010-128463 (published on Nov. 11, 2010), a method of emitting red light by doping a nitride semiconductor with a rare earth element without using a wavelength conversion material or a different kind of compound semiconductor material is disclosed. In Japanese Unexamined Patent Application Publication No. 2019-212308 (published on Sep. 17, 2009), a method in which a rare earth element is excited by ultraviolet light to emit red, green, and blue light is disclosed.

In order to realize an inexpensive and highly reliable full color display element, integration of light-emitting devices that emit three primary colors of red, green, and blue on the same semiconductor substrate is demanded. However, when a wavelength conversion material is used, light emission wavelength distribution is wide, color rendering properties are not improved, and there remains a concern about reliability. When a different kind of compound semiconductor is used, a process becomes very complicated and yield is low, and thus it is difficult to reduce a production cost.

The present disclosure has been made in view of the problems described above, and intends to realize a structure of micro light-emitting diode and a manufacturing method thereof that enable integration of light-emitting devices having different light emission wavelengths by a simpler process, without going through a complicated process such as bonding different compound semiconductors or selectively removing a part thereof.

SUMMARY

A micro light-emitting diode according to one embodiment of the present disclosure includes a first micro light-emitting diode including a first light-emitting layer that emits light of a first wavelength and emitting light at the first wavelength, and a second micro light-emitting diode including the first light-emitting layer and a second light-emitting layer that emits light of a second wavelength longer than the first wavelength, and emitting light at the second wavelength, in which the first micro light-emitting diode and the second micro light-emitting diode are both made of a nitride semiconductor, the second light-emitting layer is a nitride semiconductor layer doped with a second rare earth element, and the nitride semiconductor of the first micro light-emitting diode and the nitride semiconductor of the second micro light-emitting diode are separated from each other.

A micro light-emitting diode according to an embodiment of the present disclosure includes a first micro light-emitting diode that includes a first light-emitting layer containing a first rare earth element and emits light at a first wavelength and a second micro light-emitting diode that includes a second light-emitting layer containing a second rare earth element and emits light at a second wavelength longer than the first wavelength, in which the first micro light-emitting diode and the second micro light-emitting diode are both made of a nitride semiconductor, and the first light-emitting layer and the second light-emitting layer are both covered with an electrode layer in plan view.

A manufacturing method of a micro light-emitting diode according to an embodiment of the present disclosure includes forming a nitride semiconductor layer including a first light-emitting layer that emits light of a first wavelength and a second light-emitting layer that is formed by doping a second rare earth element and emits light of a second wavelength longer than the first wavelength, and separating the nitride semiconductor layer formed in the forming the nitride semiconductor layer into a first micro light-emitting diode that includes the first light-emitting layer and emits light at the first wavelength and a second micro light-emitting diode that includes the first light-emitting layer and the second light-emitting layer and emits light at the second wavelength.

A manufacturing method of a micro light-emitting diode according to an embodiment of the present disclosure includes forming a first micro light-emitting diode that includes a first light-emitting layer containing a first rare earth element and emits light at a first wavelength, with a nitride semiconductor, forming a second micro light-emitting diode that includes a second light-emitting layer containing a second rare earth element and emits light at a second wavelength longer than the first wavelength, with a nitride semiconductor, and covering the first light-emitting layer and the second light-emitting layer with an electrode layer in plan view.

BRIEF DESCRIPTION OF THE DRAWINGS

FIGS. 2A to 2D are cross-sectional views illustrating an example of a manufacturing method of the micro LED.

FIGS. 3A to 3C are a continuation of FIG. 2 and are cross-sectional views illustrating the example of the manufacturing method of the micro LED.

FIGS. 4A to 4C are a continuation of FIG. 3 and are cross-sectional views illustrating the example of the manufacturing method of the micro LED.

FIGS. 5A to 5D are cross-sectional views illustrating an example of a manufacturing method of a micro LED according to a modification example of Embodiment 1 of the present disclosure.

FIGS. 6A to 6C are a continuation of FIG. 5 and are cross-sectional views illustrating an example of a manufacturing method of the micro LED.

FIG. 7 is a cross-sectional view schematically illustrating an example of a schematic configuration of a micro LED according to Embodiment 2 of the present disclosure.

FIGS. 9A to 9C are cross-sectional views illustrating an example of a manufacturing method of the micro LED.

FIGS. 10A to 10D are a continuation of FIG. 9 and are cross-sectional views illustrating the example of the manufacturing method of the micro LED.

FIGS. 11A to 11D are a continuation of FIG. 10 and are cross-sectional views illustrating the example of the manufacturing method of the micro LED.

FIGS. 13A to 13D are cross-sectional views illustrating an example of a manufacturing method of the micro LED.

FIGS. 14A to 14D are a continuation of FIG. 13 and are cross-sectional views illustrating the example of the manufacturing method of the micro LED.

FIGS. 15A to 15D are a continuation of FIG. 14 and are cross-sectional views illustrating the example of the manufacturing method of the micro LED.

FIG. 20 is a cross-sectional view schematically illustrating an example of a schematic configuration of a micro LED according to Embodiment 6 of the present disclosure.

DESCRIPTION OF THE EMBODIMENTS

Figure 1:
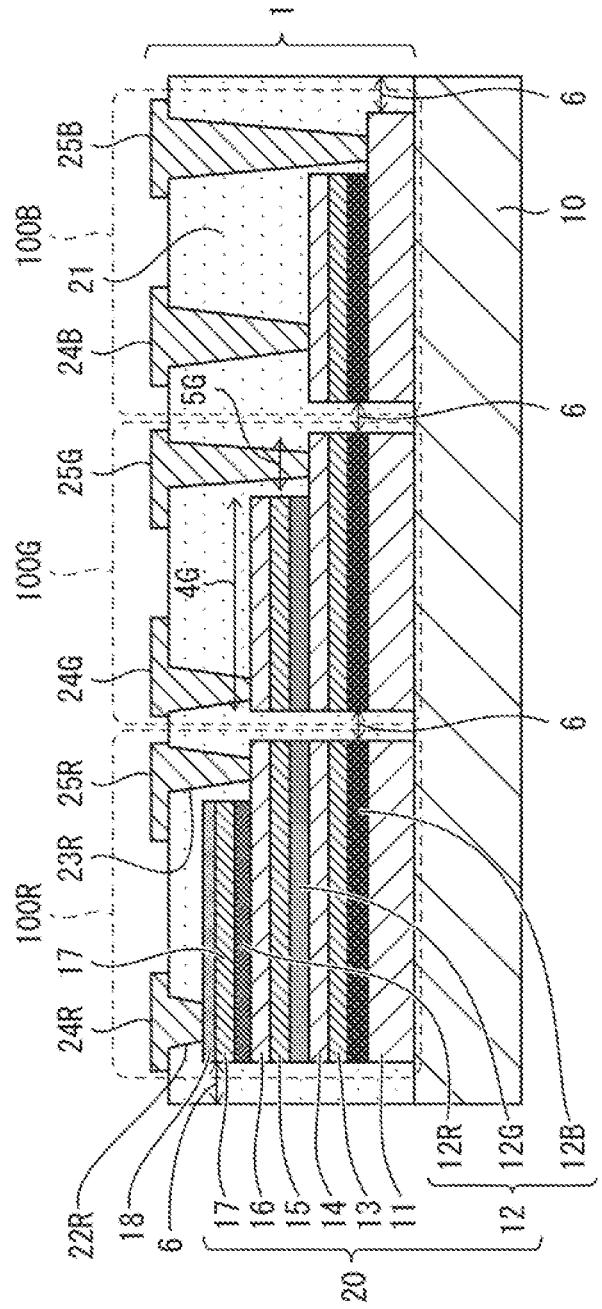
FIG. 1 is a cross-sectional view schematically illustrating an example of a schematic configuration of a micro LED according to Embodiment 1 of the present disclosure.

Hereinafter, embodiments of the present disclosure will be described in detail. For convenience of explanation, members having the same functions as the members described in each embodiment are denoted by the same reference numerals, and description thereof will be omitted as appropriate. In the following description, it is assumed that the vertical direction is indicated by regarding a side on which a nitride semiconductor layer is disposed with respect to a substrate as the upper side. For example, it is assumed that, in FIG. 1, the vertical direction is indicated by regarding a direction in which a nitride semiconductor layer 20 is disposed with respect to a growth substrate 10 as the upper side, and it is assumed that, in FIG. 8, the vertical direction is indicated by regarding a direction in which a nitride semiconductor layer 20a is disposed with respect to a drive circuit substrate 50a as the upper side.

The following vertical directions are for convenience of explanation, and the implementation of the present disclosure is not limited to these directions. In the following, as a typical case, the micro LED 1 will be described in terms of a configuration in which micro LEDs 100 of three primary colors of red, green, and blue are integrated one by one, but is not limited thereto. The micro LED 1 can include a plurality of micro LEDs 100 that emit light at the same wavelength, micro LEDs 100 having different light emission wavelength bands can be added thereto, or can also reduce the number of the micro LEDs 100 to two colors in the micro LED 1, depending on the application.

Embodiment 1

Micro LED

Hereinafter, a structure and a manufacturing method of the micro LED 1 in which the micro LEDs (micro light-emitting diodes) 100 for red light emission, green light emission, and blue light emission are disposed on the same growth substrate 10 will be described. When distinguishing the micro LED of each light emission color, an alphabet representing a color is added at the end, such as 100R, 100G, and 100B. When no alphabet is added, it represents the whole. The same applies to other constitutional elements of the micro LED 1.

FIG. 1 is a cross-sectional view schematically illustrating an example of a schematic configuration of the micro LED 1 according to Embodiment 1 of the present disclosure. As illustrated in FIG. 1, in the micro LED 1, each micro LED 100 (red light-emitting micro LED 100R, green light-emitting micro LED 100G, and blue light-emitting micro LED 100B) is disposed on a growth substrate 10.

One set of each micro LED 100 is illustrated in FIGS. 1 to 4, but is not limited thereto. The micro LEDs 100 may be repeatedly disposed in a two-dimensional array, and disposition of the micro LEDs 100 is not demanded to be disposed in a row as illustrated in FIG. 1 and various dispositions are possible.

The micro LED 1 includes (1) a blue light-emitting micro LED 100B (first micro light-emitting diode) including a blue light-emitting layer 12B (first light-emitting layer) that emits light of a first wavelength and emitting light at a first wavelength, (2) a green light-emitting micro LED 100G (second micro light-emitting diode) including the blue light-emitting layer 12B and a green light-emitting layer 12G (second light-emitting layer) that emits light of a second wavelength longer than the first wavelength, and emitting light at the second wavelength, and (3) a red light-emitting micro LED 100R (third micro light-emitting diode) including the blue light-emitting layer 12B, the green light-emitting layer 12G, and a red light-emitting layer 12R (third light-emitting layer) that emits light of a third wavelength longer than the second wavelength, and emitting light at the third wavelength. The red light-emitting micro LED 100R, the green light-emitting micro LED 100G, and the blue light-emitting micro LED 100B are made of a nitride semiconductor. The red light-emitting micro LED 100R, the green light-emitting micro LED 100G, and the blue light-emitting micro LED 100B are separated from each other.

Each micro LED 100 includes a nitride semiconductor layer 20, a protection film 21, a P-electrode 24, and an N-electrode 25. The nitride semiconductor layer 20 is a combination of an N-side layer, a light-emitting layer 12, and a P-side layer, and is formed by repeatedly stacking the N-side layer, the light-emitting layer 12, and the P-side layer in this order from the growth substrate 10 as occasion demands.

Specifically, in the red light-emitting micro LED 100R, the nitride semiconductor layer 20 in which a first N-side layer 11, a blue light-emitting layer 12B, a first P-side layer 13, a second N-side layer 14, a green light-emitting layer 12G, a second P-side layer 15, a third N-side layer 16, a red light-emitting layer 12R, and a third P-side layer 17 are stacked in this order, from the growth substrate 10, is formed. In the green light-emitting micro LED 100G, the nitride semiconductor layer 20 in which the first N-side layer 11, the blue light-emitting layer 12B, the first P-side layer 13, the second N-side layer 14, the green light-emitting layer 12G, the second P-side layer 15, and the third N-side layer 16 are stacked in this order, from the growth substrate 10, is formed. In the blue light-emitting micro LED 100B, the nitride semiconductor layer 20 in which the first N-side layer 11, the blue light-emitting layer 12B, the first P-side layer 13, and the second N-side layer 14 are stacked in this order, from the growth substrate 10, is formed. The growth substrate 10 and each layer of the nitride semiconductor layer 20 will be described later in detail.

A protection film 21 is formed so as to cover the nitride semiconductor layer 20. The P-electrode 24 and the N-electrode 25 are disposed on the surface opposite to the growth substrate 10 in each micro LED 100. With this configuration, since the micro LED 1 can be coupled to a drive circuit substrate 50 ((b) of FIG. 4) in a single coupling process by flip-chip coupling or the like, when the micro LED 1 is applied to a display element or the like, mounting of the micro LED 1 on the substrate of the display element becomes easy.

Each micro LED 100 has a light-emitting region 4 and an N-side layer contact region 5. The light-emitting region 4 indicates a region where the light-emitting layer 12 is stacked on the N-side layer positioned above the light-emitting layer 12 that emits light of a wavelength of light emitted by each micro LED 100. The light-emitting region 4 is coupled to the P-electrode 24 through a P-contact hole 22. The N-side layer contact region 5 is a region where the light-emitting layer 12 is not stacked on the N-side layer positioned below the light-emitting layer 12 that emits light of a wavelength of light emitted by each micro LED 100. The N-side layer contact region 5 is coupled to the N-electrode 25 through an N-contact hole 23. In other words, the N-electrode 25 is coupled to an N-side layer positioned below the light-emitting layer 12 and the P-electrode is coupled to an N-side layer positioned above the light-emitting layer 12.

When description is made with reference to FIG. 1, for example, in the green light-emitting micro LED 100G, an N-electrode 25G is coupled to the second N-side layer 14 and a P-electrode 24G is coupled to the third N-side layer 16. Here, the second N-side layer 14 and the third N-side layer 16 are N-side layers disposed below and above the green light-emitting layer 12G, respectively.

The third N-side layer 16 is in ohmic connection with the second P-side layer 15 by forming a tunnel junction, and the P-electrode 24G is coupled to the second P-side layer 15 via the third N-side layer 16 and holes can be injected into the green light-emitting layer 12G. A tunnel junction is also formed between the second N-side layer 14 and the first P-side layer 13, and the second N-side layer 14 and the first P-side layer 13 are in ohmic connection. Since it is difficult to reduce sheet resistance of the P-side layer, the N-side layer mainly serves as a current path for spreading the current in the horizontal direction. The sheet resistance of the N-side layer can be easily reduced, and as a result, a voltage drop due to resistance in each micro LED 100 can be suppressed. Accordingly, an application voltage demanded for driving each micro LED 100 can be reduced.

When the P-side layer and the P-electrode layer are stacked in this order on the upper side of the light-emitting layer 12, the P-electrode 24 is coupled to the P-electrode layer. For example, when the third P-side layer 17 and the F-electrode layer 13 are stacked in this order on the upper side of the red light-emitting layer 12R as in the red light-emitting micro LED 100R illustrated in FIG. 1, a P-electrode 24R is coupled to a P-electrode layer 18. The P-electrode layer 18 will be described later in detail.

In this embodiment, each of the P-electrode 24 and the N-electrode 25 is coupled to the P-electrode layer 18, the first N-side layer 11, the second N-side layer 14, or the third N-side layer 16. The P-electrode layer 18 may be a transparent electrode such as Indium tin oxide (ITO), a highly reflective metal thin film, or the same semiconductor layer as the N-side layer. By selecting such a material for the P-electrode layer 18, ohmic connection can be formed by electrode materials constituting the P-electrode 24 and the N-electrode 25, similarly as in the other N-side layers.

In this embodiment, a contact portion between the P-electrode 24 and the N-electrode 25 and the nitride semiconductor layer 20 is invariably the N-side layer. With this configuration, as the electrode material constituting the P-electrode 24 and the N-electrode 25, a material that easily forms an ohmic connection with the N-side layer may be selected, and various materials can be selected. It is difficult to form a good ohmic connection with both the N-side layer and the P-side layer using the same electrode material. For that reason, when the N-side layer and the P-side layer coexist, that is, when the P-electrode 24 and the N-electrode 25 are coupled to both the N-side layer and the P-side layer, the electrode material is demanded to be changed between the P-electrode 24 and the N-electrode 25 in some cases. In contrast, this embodiment, in which the contact portion between the P-electrode 24 and the N-electrode 25 and the nitride semiconductor layer 20 is invariably the N-side layer, has an advantage that an electrode manufacturing process can be simplified and connection resistance can be reduced.

The light-emitting layer 12 is disposed such that a light emission wavelength becomes longer as going upward from the growth substrate 10 side. In this disposition, in the case of the red light-emitting micro LED 100R, the green light-emitting layer 12G and the blue light-emitting layer 12B exist below the red light-emitting layer 12R, but these layers hardly absorb red light, and thus light loss is small. The green light-emitting micro LED 100G does not include the red light-emitting layer 12R and include the blue light-emitting layer 12B, but the blue light-emitting layer 12B hardly absorbs green light, and thus light loss is small. On the other hand, in the case of the blue light-emitting micro LED 100B, since neither the red light-emitting layer 12R nor the green light-emitting layer 12G is provided, blue light is not absorbed in the blue light-emitting micro LED 100B.

With this configuration, in this embodiment, it is possible to provide the micro LED 1 with high light emission efficiency, in which light emitted by the light-emitting layer 12 is hardly absorbed by other layers in the micro LED 1. If the red light-emitting Layer 12R and the green light-emitting layer 12G are present in the blue light-emitting micro LED 100B, these layers absorb blue light and emit red light and green light. For that reason, light emission efficiency of the blue light decreases and the blue light is mixed with the red light and the green light. In this embodiment, each micro LED 100 is configured so as not to include the nitride semiconductor layer 20 that absorbs the light emission wavelength in order not to cause such a decrease in light emission efficiency or color mixing.

In this embodiment, the nitride semiconductor layers 20 are divided by a micro LED separation region 6 for each micro LED 100, and are not coupled to each other except for the growth substrate 10. By dividing the nitride semiconductor layer 20 for each micro LED 100 in this manner, it is possible to suppress that each light emission of red, green, and blue leaks to the other micro LEDs 100 and color mixing occurs.

When the nitride semiconductor layers 20 are coupled between the micro LEDs 100, a refractive index of the nitride semiconductor layers 20 is high, and thus light is confined by total internal reflection. For that reason, light also penetrates into other micro LEDs 100, and light loss and color mixing occur. For example, when blue light emitted by the blue light-emitting micro LED 100B reaches the green light-emitting micro LED 100G and the red light-emitting micro LED 100R, the blue light is absorbed by the green light-emitting layer 12G and the red light-emitting layer 12R positioned in each micro LED 100, and green light or red light is emitted by the green light-emitting layer 12G and the red light-emitting layer 12R. As a result, blue light is reduced, and green light and red light, which is not allowed to be generated originally, are generated, and thus color mixing in which blue light is mixed with green light and red light occurs.

In order to reduce such a phenomenon, it is desirable that the nitride semiconductor layer 20 is completely divided for each micro LED 100. However, in applications where color mixing is not a major problem, it is not invariably demanded to completely divide the nitride semiconductor layer 20. In this embodiment, although the micro LED separation region 6 is filled with the protection film 21, the configuration between the micro LEDs 100 is not limited thereto. For example, the periphery of each micro LED 100 may be covered and insulated by a transparent insulating film (for example, $SiO_2$ film), and a highly reflective metal film (aluminum film, silver film, or the like) may be disposed outside thereof. By disposing the metal film on the periphery of each micro LED 100, light leakage from each micro LED 10D can be reduced. In FIG. 1, although side walls of the micro LED 100 are drawn perpendicular to the growth substrate 10, the side walls may be inclined with respect to the growth substrate 10. By inclining the side walls of the micro LED 100 with respect to the growth substrate 10 so as to open in a light emission direction, light-output efficiency of the micro LED 100 can be improved. An inclination angle (angle between the side walls and the surface of the growth substrate 10) is not demanded to be fixed, and may be, for example, 30 degrees to 60 degrees in the vicinity of the light-emitting layer 12 and the P-side layer and the N-side layer which are upper and lower layers thereof and about 80 degrees below the first N-side layer 11. Such a configuration is effective when the light emission direction is on the growth substrate 10 side.

Micro LED Manufacturing Process

Hereinafter, the manufacturing process of the micro LED 1 will be described with reference to FIGS. 2 to 4. FIGS. 2A to 2D are cross-sectional views illustrating an example of a manufacturing method of the micro LED 1. FIGS. 3A to 3C are views illustrating a continuation of FIG. 2, and FIGS. 4A to 4C are views illustrating a continuation of FIG. 3.

As illustrated in FIG. 2A, on the growth substrate 10, the first N-side layer 11, the blue light-emitting layer 12B, the first P-side layer 13, the second N-side layer 14, the green light-emitting layer 12G, and the second P-side layer 15, the third N-side layer 16, the red light-emitting layer 12R, and the third P-side layer 17 are stacked in this order (nitride semiconductor layer forming step). These layers are all nitride semiconductors, and the whole is referred to as the nitride semiconductor layer 20. As the growth substrate 10, a sapphire substrate, a SiC (silicon carbide) substrate, a silicon substrate, or the like can be used. The blue light-emitting layer 12B, the green light-emitting layer 12G, and the red light-emitting layer 12R are the light-emitting layers 12.

Each of the N-side layer and the P-side layer is generally optimized not to include a single layer but to include a plurality of layers, but since it is not directly related to the present disclosure, a detailed structure of each layer is omitted. Although light-emitting layer 12 is usually sandwiched between an N-type layer and a P-type layer, the N-type layer or the P-type layer may include a non-doped layer, and in some cases, a layer having a dopant having opposite conductivity, and thus the N-type layer and the p-type layer are hereinafter described as an N-side layer and a P-side layer.

This series of deposition processes can be performed in a metal organic chemical vapor deposition (MOCVD) apparatus without taking the growth substrate 10 out of the MOCVD apparatus on the way. In one MOCVD apparatus, the deposition may be performed by providing dedicated chambers for performing a process of growing the P-side layer and a process of growing another layer, respectively. A magnesium source used when depositing the P-side layer is likely to remain in the chamber, and unintended doping of magnesium into the N-side layer can be avoided by using a separate chamber. Mixing of magnesium into the N-side layer may degrade quality of the N-side layer. Until the magnesium source is sufficiently reduced, the time loss of waiting for the deposition of the N-side layer can also be reduced.

The first N-side layer 11 includes, on the growth substrate 10, a buffer layer for growing the nitride semiconductor layer 20 by the heteroepitaxy method, a GaN layer for improving crystallinity, and the like. The composition of the buffer layer differs depending on the material of the growth substrate 10. The first N-side layer 11 has N-type conductivity and exhibits low sheet resistance in order to uniformly inject electrons into the blue light-emitting layer 12B. The first N-side layer 11 is a relatively thick layer having a thickness of about 1 μm to 10 μm as a whole.

The blue light-emitting layer 12B is a nitride semiconductor layer doped with thulium (Tm) (first rare earth element), which is a rare earth element that emits blue light, and is, for example, a GaN layer. The thickness is about 200 nm to 600 nm. The concentration of Tm is about $1E18/cm^3$ to $1E20/cm^3$. Electrons are injected from the first N-side layer 11 and holes are injected from the first P-side layer 13, so that the blue light-emitting layer 12B emits blue light.

The first P-side layer 13 is a P-type layer for injecting holes into the blue light-emitting layer 12B, and has a thickness of about 50 nm to 500 nm. The first P-side layer 13 and the second N-side layer 14 form a tunnel junction, and form ohmic connection in a layer thickness direction.

Generally, the sheet resistance of the P-type layer is very high, and thus conduction in the horizontal direction is performed via the second N-side layer 14. The second N-side layer 14 is an N-type GaN layer, and has a thickness of 300 nm to 10000 nm. The second N-side layer 14 performs injection of electrons into the green light-emitting layer 12G.

The green light-emitting layer 12G is a nitride semiconductor layer doped with erbium (Er) (a second rare earth element), which is a rare earth element that emits green light, and is, for example, a GaN layer. The thickness is about 200 nm to 600 nm. The concentration of Er is about $1E18/cm^3$ to $1E20/cm^3$. The green light-emitting layer 12G emits green light when electrons are injected from the second N-side layer 14 and holes are injected from the second P-side layer 15.

The second P-side layer 15 has the same configuration as the first P-side layer 13, and the third N-side layer 16 has the same configuration as the second N-side layer 14. That is, the second P-side layer 15 and the third N-side layer 16 form a tunnel junction and are subjected to ohmic connection in the layer thickness direction. The sheet resistance of the second P-side layer 15 is high, and conduction in the layer is mainly performed by the third N-side layer 16.

The red light-emitting layer 12R is a nitride semiconductor layer doped with europium (Eu) (third rare earth element), which is a rare earth element that emits red light, and is, for example, a GaN layer. The thickness is about 200 nm to 600 nm. The concentration of Eu is about $1E18/cm^3$ to $1E20/cm^3$.

The third N-side layer 16 injects electrons into the red light-emitting layer 12R and the third P-side layer 17 injects holes into the red light-emitting layer 12R, so that the red light-emitting layer 12R emits red light. Since the third P-side layer 17 alone has insufficient conductivity in the horizontal direction, the P-electrode layer 18 is deposited. In FIGS. 2 to 4, when the light emission direction is upward, the P-electrode layer 18 is configured by a transparent conductive film such as ITO. On the other hand, when the light emission direction is downward, the P-electrode layer 18 may be a highly reflective metal material. In this embodiment, although the P-electrode layer 18 is deposited on the nitride semiconductor layer 20 in the process of FIG. 2A, the P-electrode layer 18 may be formed later.

Next, as illustrated in FIG. 2B, the P-electrode layer 18, the third P-side layer 17, and the red light-emitting layer 12R are etched. These layers are left only in a red light-emitting portion (red light-emitting region 4R).

Next, as illustrated in FIG. 2C, the third N-side layer 16, the second P-side layer 15, and the green light-emitting layer 12G are etched. In this etching process, a coupling region (N-side contact region 5R) between the N-side layer and the N-electrode 25 and a green light-emitting portion (green light-emitting region 4G) of the red light-emitting micro LED 100R are left, and the other portions are etched.

Next, as illustrated in FIG. 2D, the second N-side layer 14, the first P-side layer 13, and the blue light-emitting layer 12B are etched. In this etching process, a coupling region (N-side layer contact region 5G) between the N-side layer and the N-electrode 25 of the green light-emitting micro LED 100G and a blue light-emitting portion (blue light-emitting region 4B) are left, and the other portions are etched.

Next, as illustrated in FIG. 3A, the first N-side layer 11 is etched. What is left in this etching process is only the coupling region (N-side layer contact region 53) between the N-side layer and the N-electrode 25 of the blue light-emitting micro LED 100B. By this etching process, the nitride semiconductor layers 21 are divided for each micro LED 100 and are not coupled to each other except for the growth substrate 10. In other words, the micro LED separation region 6 is formed by the etching processes illustrated in FIGS. 2B to 2D and FIG. 3A (separating step). By dividing the nitride semiconductor layer 20 for each micro LED 100 in this way, it is possible to suppress that each light emission of red, green, and blue light leaks to the other micro LED 100 and color contrast decreases. When the light emission direction is downward, in the etching processes illustrated in FIGS. 2B to 2D, the side walls of the nitride semiconductor layer 20 to be etched may not be perpendicular to the growth substrate 10 as illustrated in the figures, but may be inclined in a forward taper so that the micro LED separation region 6 opens upward from the growth substrate 10. Similarly, in the etching process illustrated in FIG. 3A, the side walls may be inclined.

When the nitride semiconductor layer 20 is coupled between the micro LEDs 100, the refractive index of the nitride semiconductor layer 20 is high, and thus light is confined due to total internal reflection, light penetrates into other micro LEDs 100, and light loss and color mixing occur. For example, when blue light emitted by the blue light-emitting micro LED 100B reaches the green light-emitting micro LED 100G and the red light-emitting micro LED 100R, the blue light is absorbed by the green light-emitting layer 12G and the red light-emitting layer 12R positioned in each micro LED 100, and green light or red light is emitted by the green light-emitting layer 12G and the red light-emitting layer 12R. As a result, blue light is reduced, and green light and red light, which is not allowed to be generated, are generated, and thus color mixing in which blue light is mixed with green light and red light occurs.

In order to reduce such a phenomenon, it is desirable that the nitride semiconductor layer 20 is completely divided for each micro LED 100. However, in applications where color mixing is not a major problem, it is not invariably demanded to completely divide the nitride semiconductor layer 20.

Next, as illustrated in FIG. 3B, the entire nitride semiconductor layer 20 is covered with the protection film 21. The protection film 21 covers the upper part and side walls of each micro LED 100 except for an interface with the growth substrate 10. The protection film 21 is an insulating film such as $SiO_2$ (silicon oxide), SiN (silicon nitride), and SiON (silicon oxynitride). The protection film 21 may be a resin insulating film. When the light emission direction is opposite to the growth substrate 10 with respect to the nitride semiconductor layer 20, the protection film 21 is demanded to be transparent. When the light emission direction is on the growth substrate 10 side with respect to the nitride semiconductor layer 20, the protection film 21 is not definitely demanded to be transparent, and may be a light-shielding resin material. The surface of the protection film 21 is desirably flattened by chemical mechanical polishing (CMP) or the like. This is for facilitating electrical coupling when coupling to the drive circuit substrate 50 (FIG. 4B) for driving the micro LED 1 later.

Next, as illustrated in FIG. 3C, in order to provide the P-electrode 24 and the N-electrode 25 for each micro LED 100, the P-contact hole 22 and then N-contact hole 23 are opened in the protection film 21. A P-contact hole 22R of the red light-emitting micro LED 100R is opened above the P-electrode layer 18 (red light-emitting region 4R). An N-contact hole 23R is opened above the N-side layer contact region 5R. Similarly, a P-contact hole 22G of the green light-emitting micro LED 100G is opened above the green light-emitting region 4G. An N-contact hole 23G is opened above the N-side layer contact region 5G. A P-contact hole 22B of the blue light-emitting micro LED 100B is opened above the blue light-emitting region 4B. An N-contact hole 23B is opened above the N-side layer contact region 5B.

Next, as illustrated in FIG. 4A, for each micro LED 100, the P-electrode 24 and the N-electrode 25 are formed to cover the P-contact hole 22 and the N-contact hole 23, respectively. In other words, the P-electrode 24 is formed so that the P-contact hole 22 is filled with the P-electrode 24, and the N-electrode 25 is formed such that the N-contact hole 23 is filled with the N-electrode 25. The P-electrode 24 and the N-electrode 25 may be composed of a plug portion filling the P-contact hole 22 and the N-contact hole 23, and a flat electrode layer coupled to the plug portion.

The micro LED 1 thus formed is bonded to a drive circuit substrate 50 including a drive circuit DC for supplying a current to each micro LED 100 and controlling an amount of light emission. As illustrated in FIG. 4B, the drive circuit substrate 50 includes a red micro LED drive circuit DCR, a green micro LED drive circuit DCG, and a blue micro LED drive circuit DCB that drive the red light-emitting micro LED 100R, the green light-emitting micro LED 100G, and the blue light-emitting micro LED 100B. The drive circuit substrate 50 includes a P-side electrode 51 and an N-side electrode 52 coupled to the P-electrode 24 and the N-electrode 25 of each micro LED 100, respectively. The coupling between the P-electrode 24 and the N-electrode 25 and the P-side electrode 51 and the N-side electrode 52 is made via a coupling material 53 such as a bump. FIGS. 4B and 4C are views illustrated with the vertical direction reversed from FIG. 4A.

After the micro LED 1 is coupled to the drive circuit substrate 50, the growth substrate 10 may be peeled from the nitride semiconductor layer 20, as illustrated in FIG. 4C. When the drive circuit substrate 50 is a non-transparent substrate such as a silicon substrate, light is emitted to the side, where the growth substrate 10 was present, opposite to the drive circuit substrate 50. In contrast, when the drive circuit substrate 50 is a transparent substrate such as a glass substrate or a quartz substrate, light can be emitted to the drive circuit substrate 50 side.

As described above, according to the structure and the manufacturing process of this embodiment, the light-emitting layers 12 that emit light of different wavelengths can be formed on the same growth substrate 10 by a simple manufacturing process. Furthermore, it is possible to suppress the occurrence of light emission loss and color mixing caused by absorption of short wavelength light by the long wavelength light-emitting layer. The drive voltage of each micro LED 100 can be reduced. The P-electrode 24 and the N-electrode 25 can be formed of the same material on the surface opposite to the growth substrate 10 with respect to the nitride semiconductor layer 20, and a mounting process with the drive circuit substrate 50 can be simplified.

In other words, according to this embodiment, it is possible to realize the micro LED 1 in which the micro LEDs 100 emitting three primary colors of red, green, and blue are monolithically integrated on the same growth substrate 10. As a result, a full color display element can be manufactured at low cost.

MODIFICATION EXAMPLE

In the manufacturing process described above, since the dry etching technique is frequently used for processing the micro LED 1, damage during dry etching remains on the side walls of the light-emitting layer 12, and the light emission efficiency near the side walls may be decreased. Such a decrease in the light emission efficiency near the outer periphery of each micro LED 100 becomes a greater problem because the smaller the size of each micro LED 100, the higher the ratio of the outer peripheral portion. In order to improve the problem described above, it is demanded to reduce the damage during dry etching while recovering the damage by heat treatment or the like. This modification example is a modification example for improving the damage. In this modification example, the side walls of the blue light-emitting layer 12B, the green light-emitting layer 12G, and the red light-emitting layer 12R are covered with a high-resistance nitride semiconductor layer.

FIGS. 5A to 5D are cross-sectional views illustrating an example of a manufacturing method of a modification example of the micro LED 1. FIGS. 6A to 6D are views illustrating a continuation of FIG. 5. As illustrated in FIGS. 5A to 5D and FIG. 6A, the processes similar to FIGS. 2A to 2D and FIG. 3A, which are the manufacturing processes of Embodiment 1, are performed without forming the P-electrode layer 18. Thereafter, as illustrated in FIG. 6B, a side wall high-resistance layer 35 of thin nitride semiconductor side wall (high-resistance nitride semiconductor layer) is deposited on the micro LED 1 in the course of manufacturing illustrated in FIG. 6A, and the side wall high-resistance layer 35 is removed from the flat portion by etch-back and is left only on the side wall portion. The side wall high-resistance layer 35 is, for example, a GaN layer. The side wall high-resistance layer 35 is grown at a temperature of about 600° C. to 900° C. with a thickness of about 10 nm to 500 nm. By the heat treatment during growth of the side wall high-resistance layer 35 and the growth reaction at the side wall, damage during the dry etching in the processes illustrated in FIGS. 5A to 5C and FIG. 6A can be recovered.

Next, as illustrated in FIG. 6C, the P-electrode layer 18 is formed on the third P-side layer 17 of the red light-emitting micro LED 100R, and thereafter, the same processes as that of FIG. 3B and subsequent processes are performed. In the modification example described above, the same effect as that of Embodiment 1 can be obtained, and an additional effect that a decrease in light emission efficiency can be suppressed when the micro LED 100 is miniaturized can be obtained.

Embodiment 2

A micro LED 1_0 according to Embodiment 2 of the present disclosure will be described with reference to FIG. 7. FIG. 7 is a cross-sectional view schematically illustrating an example of a schematic configuration of the micro LED 1_0 according to Embodiment 2 of the present disclosure. The micro LED 1_0 is different from the micro LED 1, as compared with the micro LED 1, in that a dummy structure 101 is provided adjacent to the blue light-emitting micro LED 100B, and the micro LED 100 and its manufacturing process are the same as those in Embodiment 1.

In Embodiment 1, the surface of the protection film 21 on the electrode side of the micro LED 100 is demanded to be flat to facilitate mounting of the micro LED 100. However, in the structure of Embodiment 1, when an area of the blue light-emitting micro LED 100B is large, dishing occurs during the CMP of the surface of the protection film 21 and the surface of the protection film 21 of the blue light-emitting micro LED 100B is recessed as compared with the surface of the red light-emitting micro LED 100R, and as a result, a problem that heights of the P-electrode 24B and the N-electrode 25B are reduced (thickness is reduced) occurs. This embodiment is a structure for improving this problem. In this embodiment, by disposing the dummy structure 101 similar to the red light-emitting micro LED 100R adjacent to the blue light-emitting micro LED 100B, dishing of the protection film 21 in the blue light-emitting micro LED 100B region can be reduced.

As illustrated in FIG. 7, the dummy structure 101 desirably has the same structure as the P-electrode 24R portion of the red light-emitting micro LED 100R. With this configuration, the dummy structure 101 can secure the same height (thickness) as the height (thickness) of the red light-emitting micro LED 100R. A dummy electrode 26 corresponding to the P-electrode 24R is desirably provided for fixing the dummy structure 101 to the drive circuit substrate 50 during mounting. The dummy structure 101 may have the dummy electrodes for both a P-electrode and an N-electrode, like the red light-emitting micro LED 100R. According to the structure described above, the same effect as in Embodiment 1 can be obtained. The dummy structure 101 may be one which is adjacent to the blue light-emitting micro LED 100B and has the same thickness as the green light-emitting micro LED 100G.

Embodiment 3

Figure 8:
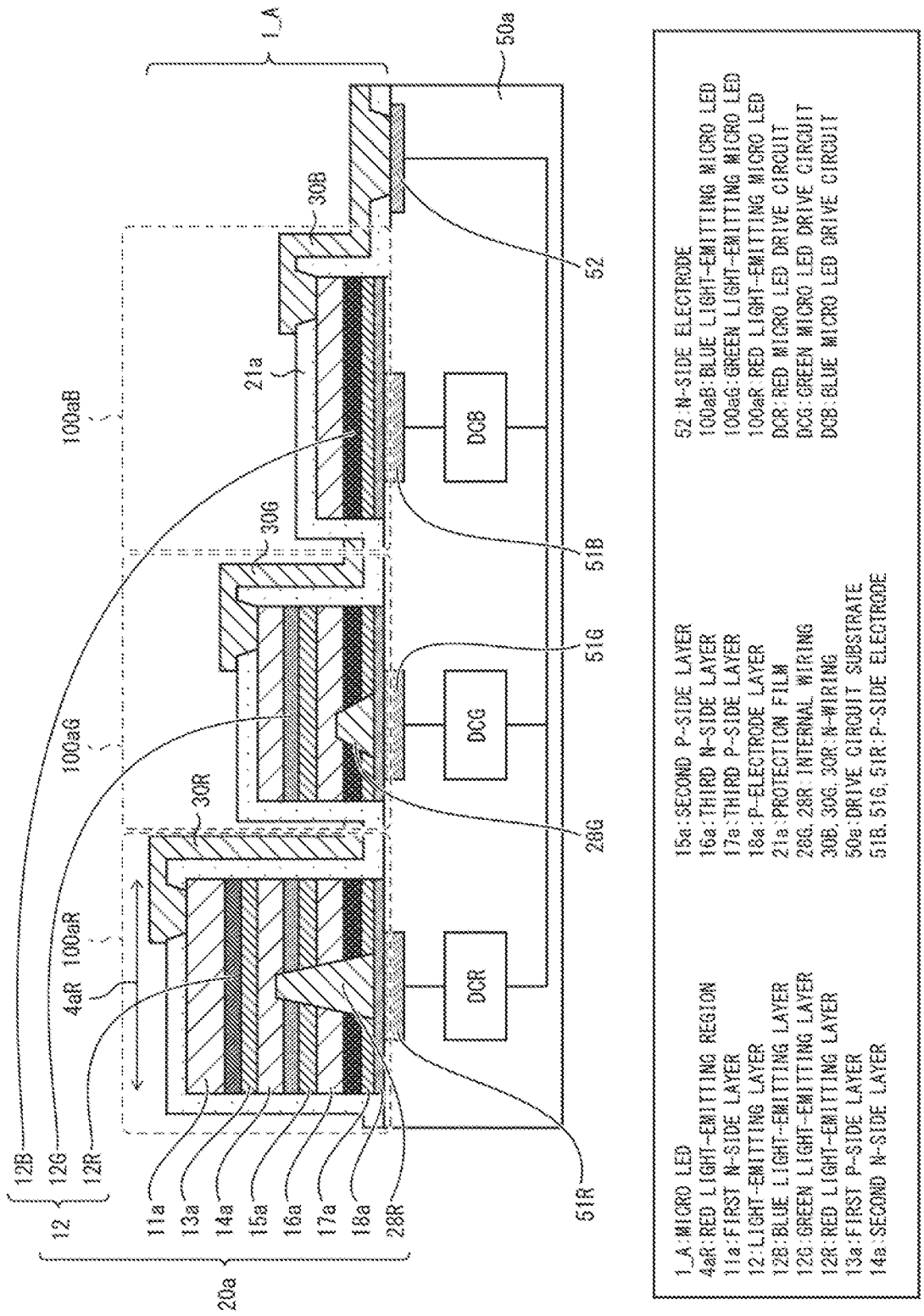
FIG. 8 is a cross-sectional view schematically illustrating an example of a schematic configuration of a micro LED according to Embodiment 3 of the present disclosure.

A micro LED 1_A according to Embodiment 3 of the present disclosure will be described with reference to FIG. 8. FIG. 8 is a cross-sectional view schematically illustrating an example of a schematic configuration of the micro LED 1_A according to Embodiment 3 of the present disclosure. The micro LED 1_A is different from the micro LED 1, as compared with the micro LED 1, in that a micro LED 100a is disposed instead of the micro LED 100. The micro LED 1_A is different from Embodiment 1 in that the micro LED 1_A includes a nitride semiconductor layer 20a having a different configuration from the nitride semiconductor layer 20, and the nitride semiconductor layer 20a is grown on the growth substrate 10 and then transferred to another substrate to form the micro LED 100a on the substrate. In other respects, it is similar to Embodiment 1. In the following description, although the nitride semiconductor layer 20a is transferred to the drive circuit substrate 50a and the micro LED 100a is formed on the drive circuit substrate 50a, the transfer destination substrate is not limited to the drive circuit substrate 50a, and may be another intermediate substrate.

In this embodiment, the micro LED 100a is disposed on the drive circuit substrate 50a, the P-electrode is disposed on the surface on the drive circuit substrate 50a side, and the N-electrode is disposed on another surface facing the surface on the drive circuit substrate 50a side. The P-electrode of the micro LSD 100a is configured by a P-electrode layer 18a, the N-electrode is an N-side layer, and the N-side layer is coupled to an N-wiring 30.

The P-side electrode 51 coupled to the P-electrode layer 18a of the micro LED 100a and the N-side electrode 52 coupled to the N-wiring 30 are disposed on the surface (surface on the nitride semiconductor layer 20a side) of the drive circuit substrate 50a. The P-side electrode 51 is provided for each micro LED 101a. The N-side electrode is a common electrode for three micro LEDs 100a of a red light-emitting micro LED 100aR, a green light-emitting micro LED 100aG, and a blue light-emitting micro LED 100aB. Between the P-side electrode 51 and the N-side electrode 52, a red light-emitting micro LED drive circuit DCR, a green light-emitting micro LED drive circuit DCG, and a blue light-emitting micro LED drive circuit DCB for driving the red light-emitting micro LED 100aR, the green light-emitting micro LED 100aG, and the blue light-emitting micro LED 100aB are provided.

Similarly as in Embodiment 1, in the micro LED 100a, the blue light-emitting micro LED 100aB does not include the red light-emitting layer 12R and the green light-emitting layer 12G. For that reason, the problem of a decrease in efficiency or color mixing due to the absorption of blue light inside is not caused. In each micro LED 100a, the nitride semiconductor layer 20a is completely separated from each other, and the decrease in efficiency and occurrence of color mixing due to penetration of blue light into the red light-emitting micro LED 100aR or the green light-emitting micro LED 100aG are suppressed. Accordingly, this embodiment also exhibits the same effect as Embodiment 1.

Furthermore, in this embodiment, since the nitride semiconductor layer 20a of each micro LED 100a is directly coupled to the drive circuit substrate 50a, heat generated when each micro LED 100a is turned on can be efficiently transmitted to the drive circuit substrate 50a. Accordingly, temperature rise of the micro LED 100a is suppressed, and operation with higher power becomes possible.

In this embodiment, in order to couple a second N-side layer 14a coupled to a first P-side layer 13a, which is the P-side layer of the red light-emitting micro LED 100aR, and the P-electrode layer 18a, an internal wiring 28R is disposed in the nitride semiconductor layer 20a. The internal wiring 28R is made of a conductive material, and may be, for example, a transparent conductive film or a metal material such as tungsten. Similarly, in the green light-emitting micro LED 100aG, in order to couple a third N-side layer 16a coupled to a second P-side layer 15a, which is the P-side layer of the green light-emitting micro LED 100aG, and the P-electrode layer 18a, an internal wiring 28G is disposed in the nitride semiconductor layer 20a. In FIG. 8, although the internal wiring 28 fills a hole (P-internal contact hole although 27 of FIG. 9B) in the nitride semiconductor layer 20a, the P-electrode layer 18a deposited on the inner wall of the hole without filling the hole may be used as the internal wiring 28.

Micro LED Manufacturing Process

Next, a manufacturing process of the micro LED 1_A will be described with reference to FIGS. 9 to 11. FIGS. 9A to 9C are cross-sectional views illustrating an example of a manufacturing method of the micro LED 1_A. FIGS. 10A to 10D are diagrams illustrating the continuation of FIG. 9, and FIGS. 11A to 11D are diagrams illustrating the continuation of FIG. 10. FIGS. 9A to 9C are views illustrated with the vertical direction reversed from FIG. 8.

As illustrated in FIG. 9A, on the growth substrate 10, a first N-side layer 11a, the red light-emitting layer 12R, the first P-side layer 13a, the second N-side layer 14a, the green light-emitting layer 12G, the second P-side layer 15a, the third N-side layer 16a, the blue light-emitting layer 12B, and a third P-side layer 17a are stacked in this order. Although the order of deposition of the light-emitting layer 12 is reversed as compared with Embodiment 1, other points are the same as Embodiment 1.

In this embodiment, since the blue light-emitting layer 12B is deposited last as the light-emitting layer 12, a multiple-quantum well layer (multi quantum well structure) composed of an InGaN quantum well and a GaN barrier layer can also be used as the blue light-emitting layer 12B. Since rare earth element doping is generally formed at a growth temperature higher than that of an InGaN layer, if a rare earth element doping layer is deposited on the InGaN multiple-quantum well layer, the quantum well structure will be broken. Accordingly, it is difficult to apply the multiple-quantum well layer to the structure in which the blue light-emitting layer 12B is deposited first as in Embodiment 1, but this embodiment is possible.

Next, as illustrated in FIG. 9B, a P-internal contact hole 27R reaching the second N-side layer 14a is formed in a formation region of the red light-emitting micro LED 100aR. The P-internal contact hole 27R can be formed by using a photolithography process and a dry etching method. Similarly, a P-internal contact hole 27G reaching the third N-side layer 16a is formed in the formation region of the green light-emitting micro LED 100aG.

Next, as illustrated in FIG. 9C, the internal wiring 28R and the internal wiring 28G are formed in the P-internal contact hole 27R and the P-internal contact hole 27G, respectively, and the P-electrode layer 18a is formed thereon. Like the tungsten plug, the internal wiring 28 may be formed by filling the P-internal contact hole 27 with tungsten by a chemical vapor deposition (CVD) method and etching back by a CMP method or a dry etching method. Alternatively, the side wall of the P-internal contact hole 27 may have a gentle slope, a conductive material may be deposited on the inner wall, and the P-electrode layer 18a may be deposited thereon. As long as the P-electrode layer 18a can secure good electrical contact with the second N-side layer 14a or the third N-side layer 16a, any wiring method and material may be used for the internal wiring 28. However, in order to reduce light absorption on the inner wall of the P-internal contact hole 27, it is desirable to use a transparent conductive material or a highly reflective metal material for the internal, wiring 28.

Next, as illustrated in FIG. 10A, the nitride semiconductor layer 20a is bonded on the drive circuit substrate 50a. During bonding, precise alignment is performed so that the internal wiring 28R and the internal wiring 28G of the micro LED 100a face the P-side electrode 51R and the P-side electrode 51G of the drive circuit substrate 50a. Furthermore, as illustrated in FIG. 10B, the growth substrate 10 is peeled off.

Next, as illustrated in FIG. 10C, the first N-side layer 11a, the red light-emitting layer 12R, and the first P-side layer 13a are etched. In this etching process, the red light-emitting layer 12R is left only in the red light-emitting micro LED 100aR portion. In other words, in this etching process, a red light-emitting region 4aR (FIG. 8) of the red light-emitting micro LED 100aR is left, and the other portions are etched.

Next, as illustrated in FIG. 10D, the second N-side layer 14a, the green light-emitting layer 12G, and the second P-side layer 15a are etched. In this etching process, the green light-emitting layer 12G is left only in the green light-emitting micro LED 100aG portion and the red light-emitting micro LED 100aR portion. In other words, in this etching process, the red light-emitting region 4aR of the red light-emitting micro LED 100aR and a green light-emitting region 4aG of the green light-emitting micro LED 100aG are left, and the other portions are etched.

Next, as illustrated in FIG. 11A, the third N-side layer 16a, the blue light-emitting layer 12B, the third P-side layer 17a, and the P-electrode layer 18a are etched. In this etching process, the blue light-emitting layer 12B is left only in the blue light-emitting micro LED 100aB portion, the green light-emitting micro LED 100aG portion, and the red light-emitting micro LED 100aR portion. In other words, in this etching process, the red light-emitting region 4aR of the red light-emitting micro LED 100aR, the green light-emitting region 4aG of the green light-emitting micro LED 100aG, and a blue light-emitting region 4aB of the blue light-emitting micro LED 100aB are left, and other portions are etched.

By the etching process described above, the nitride semiconductor layer 20a is divided for each micro LED 100a and does not couple to each other. In this manufacturing process, although the P-electrode layer 18a is formed at the end of the etching of the nitride semiconductor layer 20a, the P-electrode layer 18a may be processed into an electrode shape on the growth substrate 10 in advance. When the light emission direction is downward, in the etching processes illustrated in FIG. 10C, FIG. 10D, and FIG. 11A, the side walls of the nitride semiconductor layer 20a to be etched may not be perpendicular to the drive circuit substrate 50a as illustrated in the figure, but are inclined with a forward taper so that the etched region opens upward from the drive circuit substrate 50a. With this configuration, formation of the N-wiring 30 formed in a later process is facilitated. When the light emission direction is on the drive circuit substrate 50a side, light-output efficiency can be improved.

Next, the whole is covered with a protection film 21a as illustrated in FIG. 11B, and N-contact holes 29R, 29G, 29B and 29C are opened as illustrated in FIG. 11C. The N-contact hole 29R reaches the first N-side layer 11a which is the N-side layer of the red light-emitting micro LED 100aR. The N-contact hole 29G reaches the second N-side layer 14a which is the N-side layer of the green light-emitting micro LED 100aG. The N-contact hole 29B reaches the third N-side layer 16a which is the N-side layer of the blue light-emitting micro LED 100aB. On the other hand, the N-contact hole 29C reaches the N-side electrode 52 on the drive circuit substrate 50a.

Next, as illustrated in FIG. 11D, an N-wiring 30R connecting the N-contact hole 29R and the N-contact hole 29C, an N-wiring 30G connecting the N-contact hole 29G and the N-contact hole 29C, and an N-wiring 30B connecting the N-contact hole 29B and the N-contact hole 29C are formed. When the light emission direction is on the side opposite to the drive circuit substrate 50a with respect to the nitride semiconductor layer 20a, the N-wiring 30 is desirably configured by a transparent conductive film. When the light emission direction is on the drive circuit substrate 50a side, the N-wiring 30 is desirably configured by a highly reflective metal film. Furthermore, the N-wiring 30 may cover the side surface or the entire upper surface of the micro LED 100a. With such a configuration, light leakage from each micro LED 100a can be suppressed, and light-output efficiency can be improved.

According to the manufacturing processes described above, the light-emitting devices (red light-emitting micro LED 100aR, green light-emitting micro LED 100aG, and blue light-emitting micro LED 100aB) of three primary colors of red, green and blue can be formed on the drive circuit substrate 50a by one growth process of the nitride semiconductor layer 20a. Furthermore, it is possible to suppress a decrease in light emission efficiency of each light emission and suppress the occurrence of color mixing. Deposition of a thick protection film and the flattening process by CMP are not demanded, and the manufacturing cost can be reduced.

Embodiment 4

Figure 12:
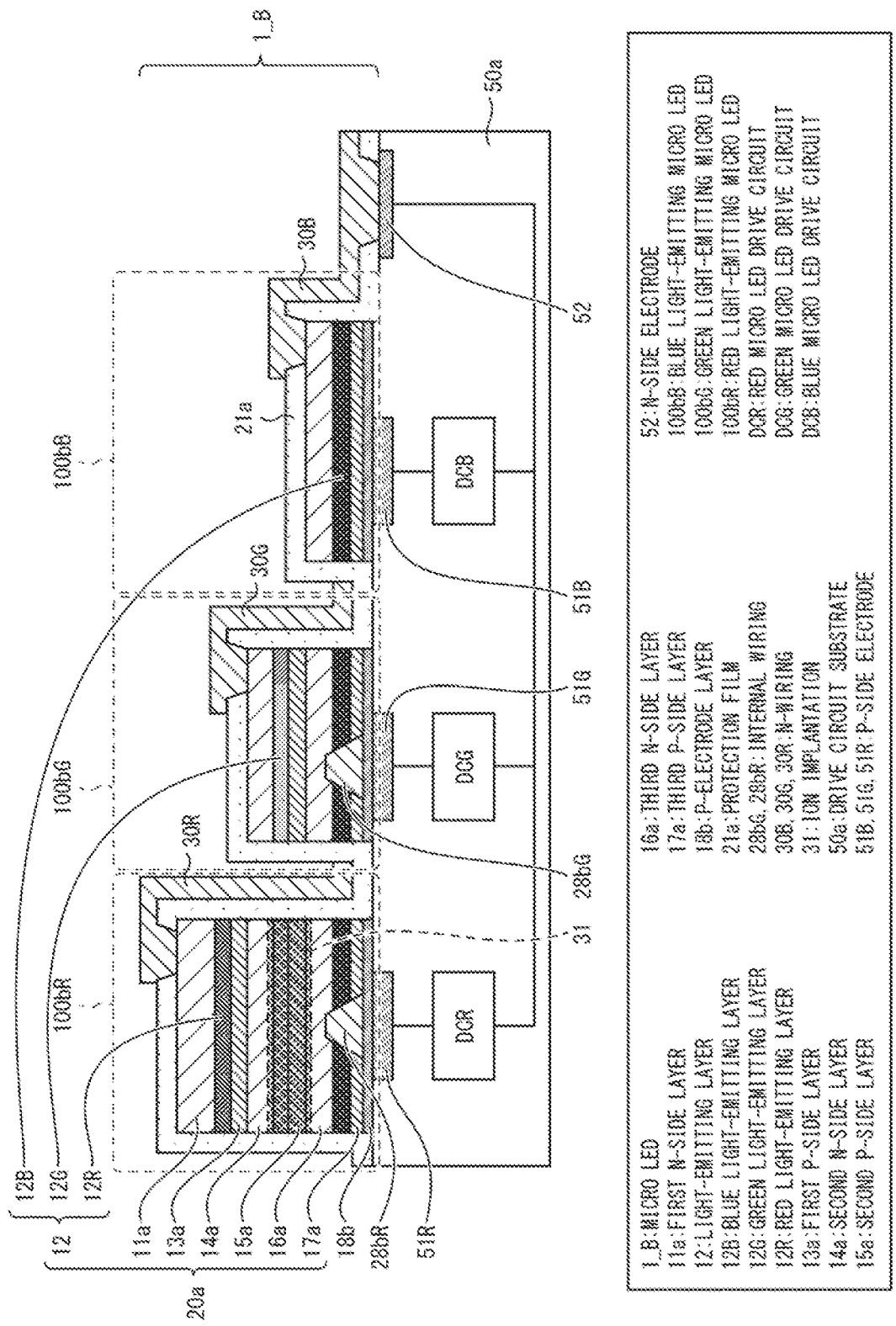
FIG. 12 is a cross-sectional view schematically illustrating an example of a schematic configuration of a micro LED according to Embodiment 4 of the present disclosure.

A micro LED 1_B according to Embodiment 4 of the present disclosure will be described with reference to FIG. 12. FIG. 12 is a cross-sectional view schematically illustrating an example of a schematic configuration of the micro LED 1_B according to Embodiment 4 of the present disclosure. FIGS. 13A to 13D are views illustrated with the vertical direction reversed from FIG. 12.

The micro LED1_B is different from the micro LED 1, as compared with the micro LED 1, in that a micro LED 100*b* is disposed instead of the micro LED 100. The micro LED 100*b* of this embodiment is similar in shape to Embodiment 3, and is different from Embodiment 3 in that a part of the internal wiring 28R of the micro LED 100*a* of Embodiment 3 is replaced by conducting the inside of the nitride semiconductor layer 20*a* by ion implantation. The other points are the same as Embodiment 3.

As illustrated in FIG. 12, in the red light-emitting micro LED 100*b*R, the portion of the second P-side layer 15*a* and the green light-emitting layer 12G is converted into N-type conductivity by ion implantation 31. Nitride semiconductors, especially GaN-based materials, can be easily converted to N-type conductivity by implanting silicon ions. A green light-emitting micro LED 100*b*G and a blue light-emitting micro LED 100*b*B are the same as in Embodiment 3. According to this embodiment, the same effect as that of Embodiment 3 can be realized.

Furthermore, in this embodiment, one type may be formed as the P-internal contact hole 27*b* FIG. 13C), and the manufacturing process can be simplified by reducing the number of etching processes. The cost of the ion implantation process is lower than that of the etching process, and the manufacturing cost can be reduced.

Micro LED Manufacturing Process

Next, a manufacturing process of the micro LED 1_B will be described with reference to FIGS. 13 to 15. FIGS. 13A to 13D are cross-sectional views illustrating an example of a manufacturing method of the micro LED 1_B. FIGS. 14A to 14D are views illustrating a continuation of FIG. 13. FIGS. 15A to 15D are views illustrating a continuation of FIG. 14. Formation of the nitride semiconductor layer 20*a* in FIG. 13A is the same as in Embodiment 3. In the following description, description of portions common to the description of FIGS. 9 to 11 in Embodiment 3 will be omitted.

As illustrated in FIG. 13B, silicon ions are implanted around the second P-side layer 15*a* and the green light-emitting layer 12G in the red light-emitting micro LED 100*b*R region. Implantation energy is selected so that the concentration of silicon subjected to ion implantation is at least $1E18/cm^3$ to $1E20/cm^3$. Ion implantation may be performed with a plurality of energies. The total dose amount is about $1E14/cm^2$ to $1E16/cm^2$. After the ion implantation, the nitride semiconductor layer 20*a* recovers the damage due to the ion implantation and activates silicon as a dopant by heat treatment.

Next, as illustrated in FIG. 13C, a P-internal contact hole 27*b*R and a P-internal contact hole 27*b*G are formed in the formation regions of the red light-emitting micro LED 100*b*R and the green light-emitting micro LED 100*b*G, respectively, so as to reach the third N-side layer 16*a*. In this embodiment, since the P-internal contact holes 27*b*R and 27*b*G have the same depth, both P-contact holes can be formed by one photolithography process and one etching process.

Next, as illustrated in FIG. 13D, the internal wiring 28*b*R and the internal wiring 28*b*G are formed in the P-internal contact hole 27*b*R and the P-internal contact hole 27*b*G, and the P-electrode layer 18*b* is formed thereon. Subsequent processes (FIGS. 14A to 14D and FIGS. 15A to 15D) are basically the same as FIGS. 10A to 10D and FIGS. 11A to 11D.

Embodiment 5

Figure 16:
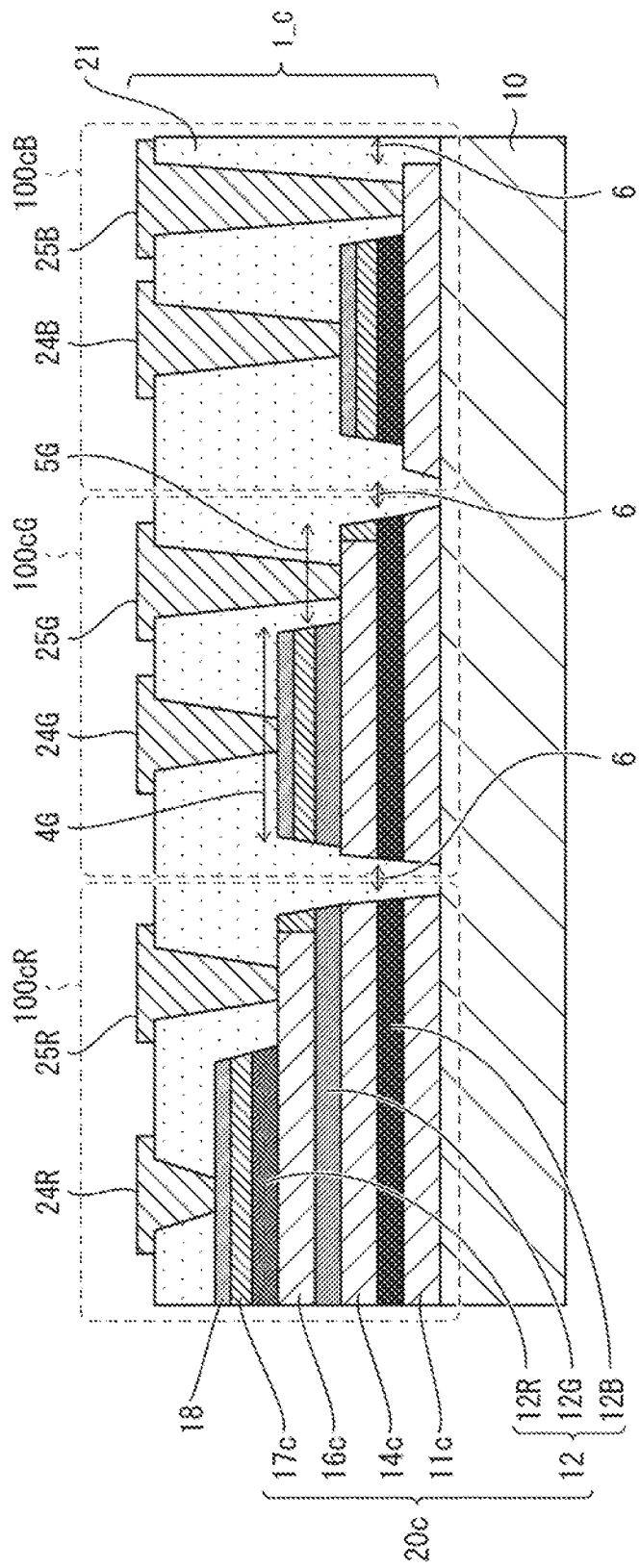
FIG. 16 is a cross-sectional view schematically illustrating an example of a schematic configuration of a micro LED according to Embodiment 5 of the present disclosure.

A micro LED 1_C according to Embodiment 5 of the present disclosure will be described with reference to FIG. 16. FIG. 16 is a cross-sectional view schematically illustrating an example of a schematic configuration of the micro LED 1_C according to Embodiment 5 of the present disclosure. The micro LED 1_C is different from the micro LED 1, as compared with the micro LED 1, in that a micro LED 100*c* is disposed instead of the micro LED 100. The micro LED 100*c* of this embodiment is similar in shape to Embodiment 1, but includes nitride semiconductor layer 20*c* different in configuration from the nitride semiconductor layer 20. Although there are differences in the manufacturing process, the same effect as in Embodiment 1 is obtained. In this embodiment, an additional effect is that a tunnel junction between the P-side layer and the N-side layer in the nitride semiconductor layer 20*c* is not demanded to be provided and there is no voltage increase due to the resistance of the tunnel junction.

As illustrated in FIG. 16, the nitride semiconductor layer 20*c* of this embodiment includes a third P-side layer 17*c* at the uppermost portion thereof, but does not include the P-side layer inside thereof. In a red light-emitting micro LED 100*c*R, a first N-side layer 11*c*, the blue light-emitting layer 12B, a second N-side layer 14*c*, the green light-emitting layer 12G, a third N-side layer 16*c*, the red light-emitting layer 12R, and a third P-side layer 17*c* are deposited in this order from the growth substrate 10 side. In a green light-emitting micro LED 100*c*G, the first N-side layer 11*c*, the blue light-emitting layer 12B, the second N-side layer 14*c*, the green light-emitting layer 12G, and the third P-side layer 17*c* are deposited in this order from the growth substrate 10 side. In a blue light-emitting micro LED 100*c*B, the first N-side layer 11*c*, the blue light-emitting layer 12B, and the third P-side layer 17*c* are deposited in this order from the growth substrate 10 side. Similar to Embodiment 1, in the micro LED 100*c*, the blue light-emitting micro LED 100*c*B does not include the red light-emitting layer 12R and the green light-emitting layer 12G, and the problem of a decrease in efficiency or color mixing due to the absorption of blue light inside is not caused. In each micro LED 100*c*, the nitride semiconductor layer 20*c* is completely separated from each other, and the decrease in efficiency and occurrence of color mixing due to penetration of blue light into the red light-emitting micro LED 100*c*R and the green light-emitting micro LED 100*c*G are suppressed. Accordingly, this embodiment also has the same effect as Embodiment 1.

Micro LED Manufacturing Process

Next, a manufacturing method of the micro LED 1_C will be described with reference to FIGS. 17 to 19. FIGS. 17A to 17D are cross-sectional views illustrating an example of a manufacturing method of the micro LED 1_C. FIGS. 18A to 18D are views illustrating a continuation of FIG. 17. FIGS. 19A to 19C are views illustrating a continuation of FIG. 18.

Figure 17A:
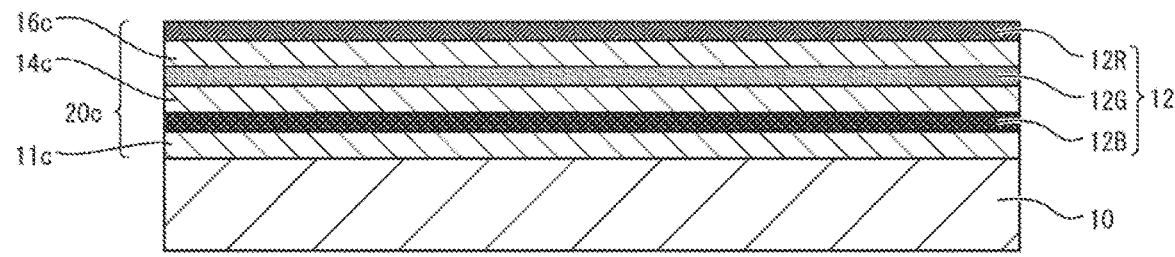
FIGS. 17A to 17D are cross-sectional views illustrating an example of a manufacturing method of the micro LED.
Figure 18A:
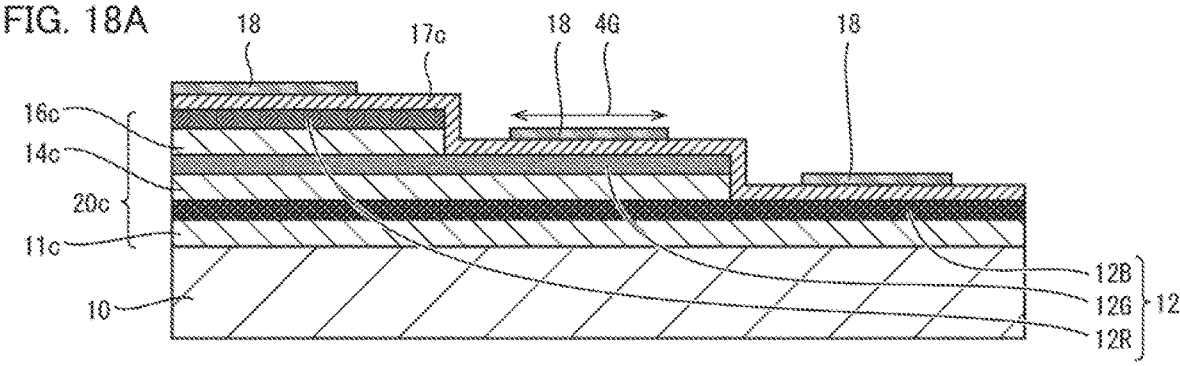
FIGS. 18A to 18C are a continuation of FIG. 17 and are cross-sectional views illustrating the example of the manufacturing method of the micro LED.

As illustrated in FIG. 17A, the first N-side layer 11*c*, the blue light-emitting layer 12B, the second N-side layer 14*c*, the green light-emitting layer 12G, the third N-side layer 16*c*, and the red light-emitting layer 12R are deposited on the growth substrate 10 in this order. At this stage, no P-side layer is included. The thickness of each light-emitting layer 12 is desirably equal, and the thickness of the third N-side layer 16*c* and the thickness of the second N-side layer 14*c* are also desirably equal.

Figure 17B:
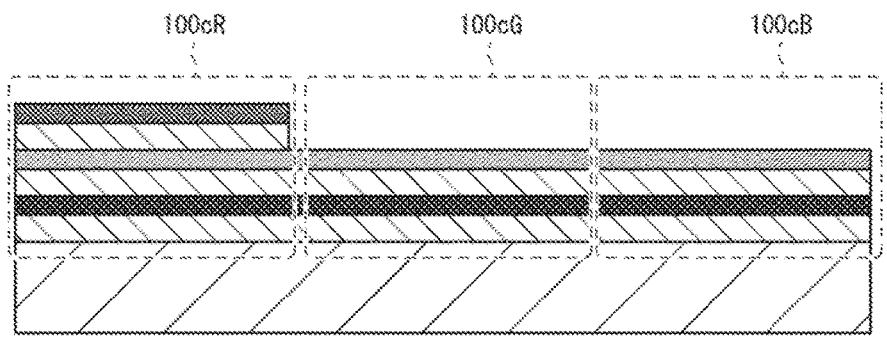

Next, as illustrated in FIG. 17B, the red light-emitting layer 12R and the third N-side layer 16*c* are etched except for the region of the red light-emitting micro LED 100*c*R.

Figure 17C:
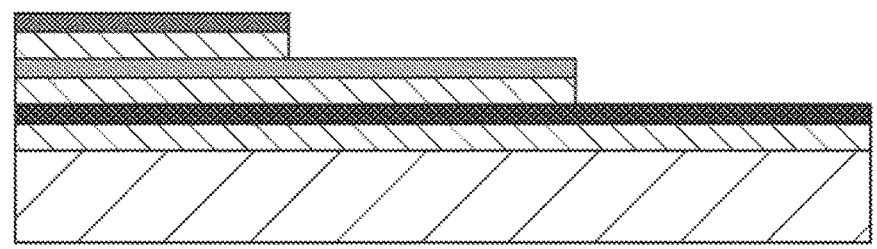

Similarly, as illustrated in FIG. 17C, the green light-emitting layer 12G and the second N-side layer 14c in the region of the blue light-emitting micro LED 100cB are etched.

Figure 17D:
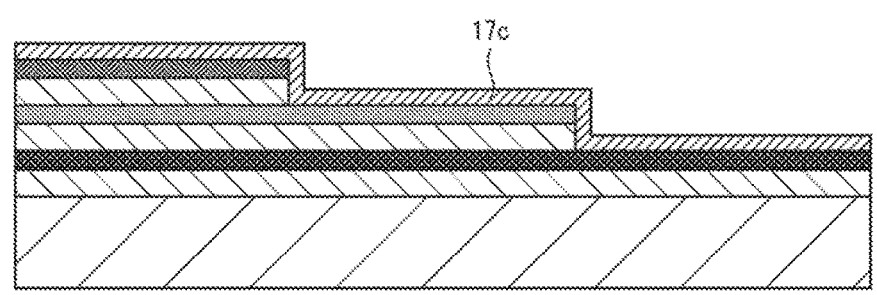

Next, as illustrated in FIG. 17D, the third P-side layer 17c is deposited on the entire surface. Furthermore, as illustrated in FIG. 18A, the P-electrode layer 18 is deposited, and the P-electrode layer 18 is patterned for each micro LED 100c while leaving a portion to be the light-emitting region 4.

Figure 18B:
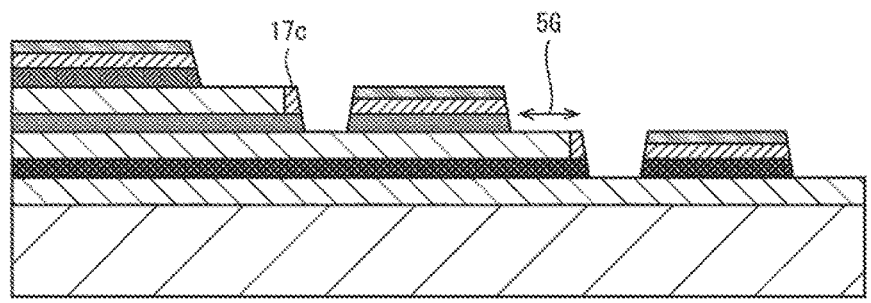
Figure 19A:
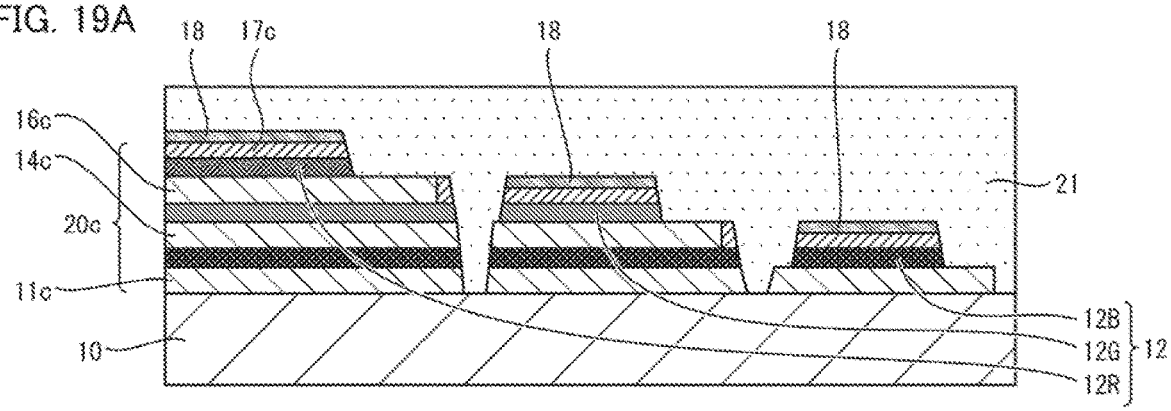
FIGS. 19A to 19C are a continuation of FIG. 18 and are cross-sectional views illustrating the example of the manufacturing method of the micro LED.
Figure 19B:
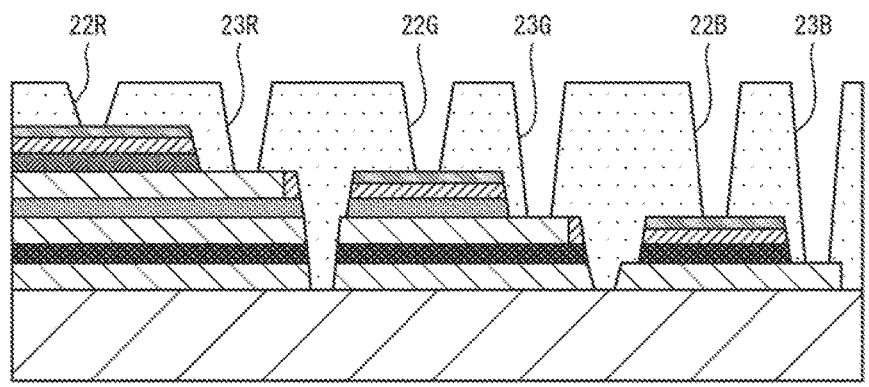
Figure 19C:
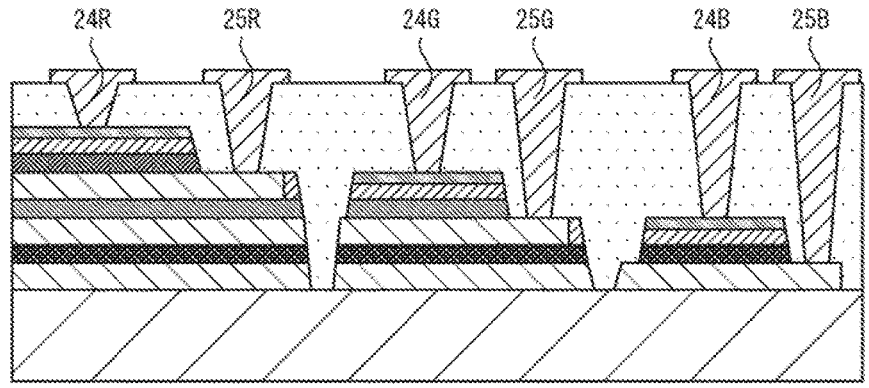

Next, as illustrated in FIG. 18B, the third P-side layer 17c and the respective light-emitting layers 12 are etched while leaving the respective light-emitting regions 4. With this configuration, a part of the third N-side layer 16c, a part of the second N-side layer 14c, and a part of the first N-side layer 11c that become the N-side layer contact region 5 are exposed.

Figure 18C:
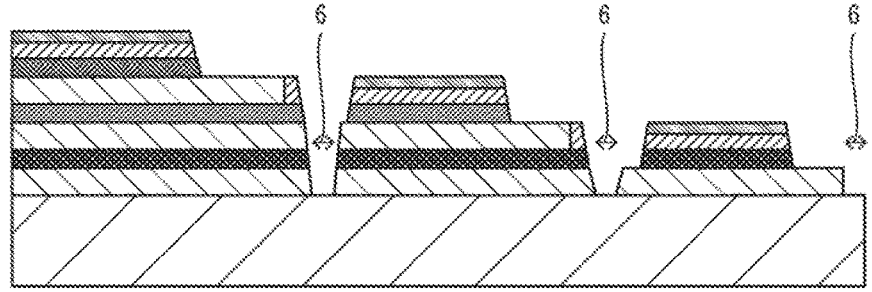

Next, as illustrated in FIG. 18C, the micro LED separation region 6 is formed, and the micro LEDs 100c are individually separated. Thereafter, as illustrated in FIG. 19A, the protection film 21 is deposited and the surface is flattened. Next, the P-contact hole 22 and the N-contact hole 23 are opened as illustrated in FIG. 19B, and the P-electrode 24 and the N-electrode 25 are formed as illustrated in FIG. 19C. Also in this embodiment, the same effect as in Embodiment 1 can be achieved.

Embodiment 6

A micro LED 1_D according to Embodiment 6 of the present disclosure will be described with reference to FIG. 20. FIG. 20 is a cross-sectional view schematically illustrating an example of a schematic configuration of the micro LED 1_D according to Embodiment 6 of the present disclosure. The micro LED 1_D is different from the micro LED 1, as compared with the micro LED 1, in that a micro LED 100d is disposed instead of the micro LED 100. The micro LED 100d of this embodiment is different from Embodiment 1 in a method of forming a light-emitting layer 12d. That is, in Embodiment 1, the light-emitting layer 12 is formed by the growth process of the nitride semiconductor layer 20, but in this embodiment, a high-resistance layer 12i (high-resistance nitride semiconductor layer), which is a non-light-emitting layer, is grown in the growth process of the nitride semiconductor layer 20d. Thereafter, the high-resistance layer 12i is selectively converted into the light-emitting layer 12d by selectively doping the high-resistance layer 12i with the rare earth element, and the light-emitting layer 12d is formed.

As illustrated in FIG. 20, a red light-emitting micro LED 100dR includes a first N-side layer 11d, a red light-emitting layer 12dR, and a first P-side layer 13d grown on the growth substrate 10. The P-electrode 24R is coupled to the first P-side layer 13d via the P-electrode layer 18. In this embodiment, the red light-emitting micro LED 100dR includes only the red light-emitting layer 12dR as the light-emitting layer 12d. Similarly, a green light-emitting micro LED 100dG includes only the green light-emitting layer 12dG as the light-emitting layer 12d, and a blue light-emitting micro LED 100dB includes only the blue light-emitting layer 12dB as the light-emitting layer 12d.

The N-electrode 25 is coupled to a part of the first N-side layer 11d left in a micro LED separation region 6d. Such a structure is characterized in that the manufacturing process is very simple and easy to manufacture. In the micro LED separation region 6d, although it is desirable to remove the nitride semiconductor layer 20d from the viewpoint of improving light emission efficiency and avoiding color mixing, the problem of improving light emission efficiency and avoiding color mixing can be reduced by reducing the thickness of the remaining nitride semiconductor layer 20d. For that reason, the structure illustrated in this embodiment can be adopted depending on the demanded performance for the micro LED 100d.

The disposition and configuration methods of the N-electrode 25 are not limited to those described above. For example, the nitride semiconductor layer 20d of the micro LED separation region 6d may be removed, and the N-electrode 25 and the first N-side layer 11d may be coupled at the side wall portion of the first N-side layer 11d. If it is difficult to dispose the P-electrode 24 and the N-electrode 25 on the same surface, the N-electrode 25 can be provided on the surface of the first N-side layer 11d on the growth substrate 10 side after mounting on the drive circuit substrate 50.

The red light-emitting layer 12dR is desirably offset from the side wall of the groove of the micro LED separation region 6d, and the high-resistance layer 12i is desirably left between the side wall and the red light-emitting layer 12dR. This is to reduce damage to the red light-emitting layer 12dR during formation of the groove in the micro LED separation region 6d. The same applies to other light emission colors.

Micro LED Manufacturing Process

Next, a manufacturing method of the micro LED 1_D will be described with reference to FIGS. 21 to 23. FIGS. 21A to 21D are cross-sectional views illustrating an example of the manufacturing method of the micro LED 1_D. FIGS. 22A to 22C are views illustrating a continuation of FIG. 21. FIGS. 23A to 23C are views illustrating a continuation of FIG. 22.

Figure 21A:
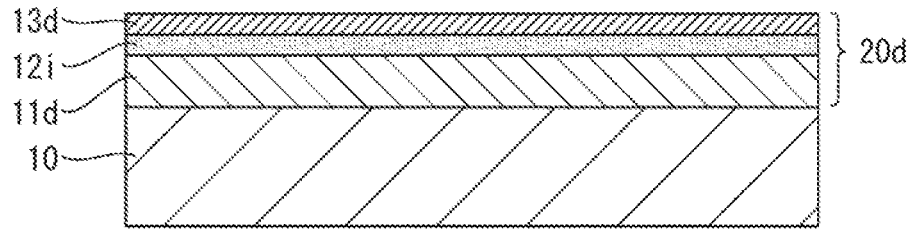
FIGS. 21A to 21D are cross-sectional views illustrating an example of a manufacturing method of the micro LED.

As illustrated in FIG. 21A, the first N-side layer 11d, the high-resistance layer 12i, and the first P-side layer 13d are deposited on the growth substrate 10 in this order. In the process of FIG. 21, since the light-emitting layer 12d is formed by an ion implantation method, the first P-side layer 13d is desirably as thin as possible, and desirably has a thickness of 21 nm to 100 nm. The thickness of the high-resistance layer 12i is about 200 nm to 500 nm.

Figure 21B:
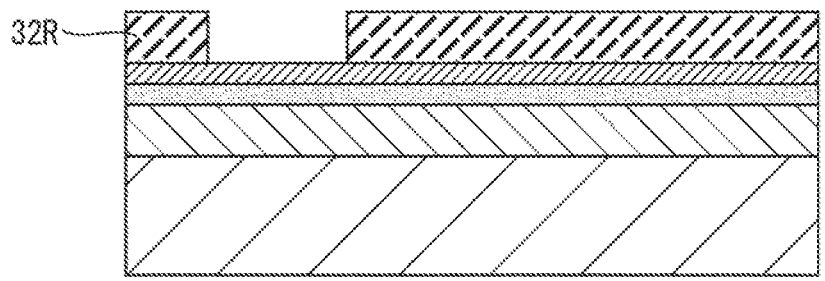
Figure 21C:
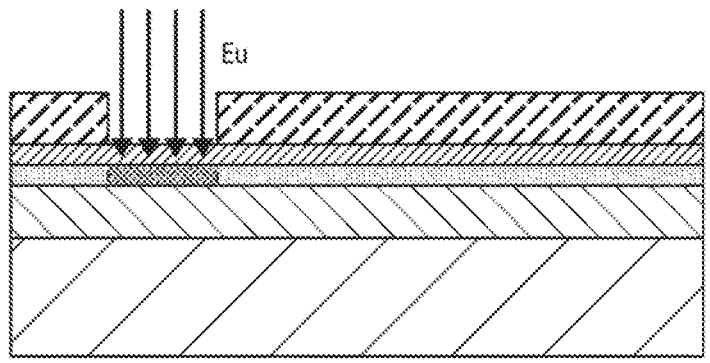
Figure 21D:
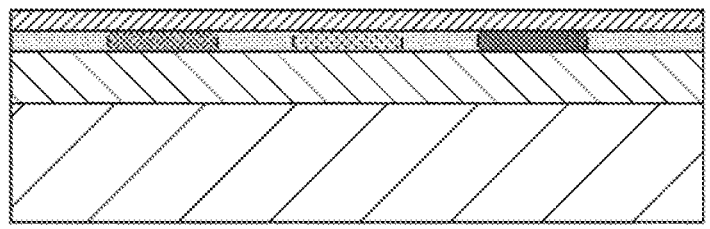

Next, as illustrated in FIG. 21B, a resist pattern 32R having an opening in a region where the red light-emitting layer 12dR is formed is formed, and as illustrated in FIG. 21C, europium (Eu) ions are implanted into the high-resistance layer 12i. It is desirable to set implantation energy so that a projection range during ion implantation is near the center of the high-resistance layer 12i. The implantation amount is $1E14/cm^3$ to $1E16/cm^3$. A similar process is performed for the green light-emitting layer 12dG and the blue light-emitting layer 12dB. For example, erbium (Er) ions are implanted into the green light-emitting layer 12dG, and thulium (Tm) ions are implanted into the blue light-emitting layer 12dB. In this way, as illustrated in FIG. 21D, a state in which each light-emitting rare earth element is subjected to ion implantation is formed in each light-emitting layer 12d (first micro light-emitting diode forming step, second micro light-emitting diode forming step).

Figure 22A:
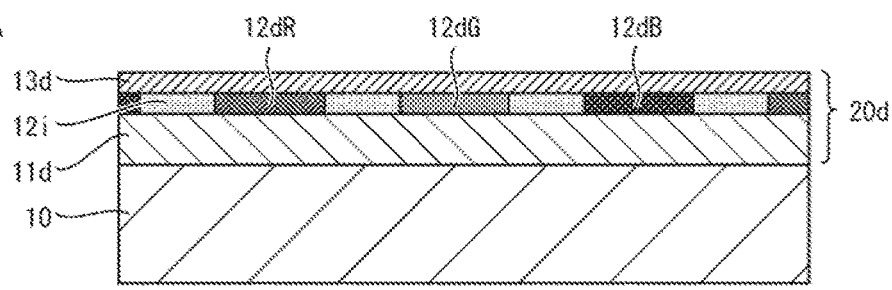
FIGS. 22A to 22C are a continuation of FIG. 21 and are cross-sectional views illustrating the example of the manufacturing method of the micro LED.

Next, as illustrated in FIG. 22A, by performing heat treatment and recrystallizing the ion-implanted layer, the red light-emitting layer 12dR, the green light-emitting layer 12dG, and the blue light-emitting layer 12dB are formed. As illustrated in FIG. 22A, the respective light-emitting layers are desirably disposed at a fixed distance away. This is because the light-emitting layer 12d is not exposed from the side walls of the micro LED separation region 6d when the micro LED separation region 6d is formed.

Figure 22B:
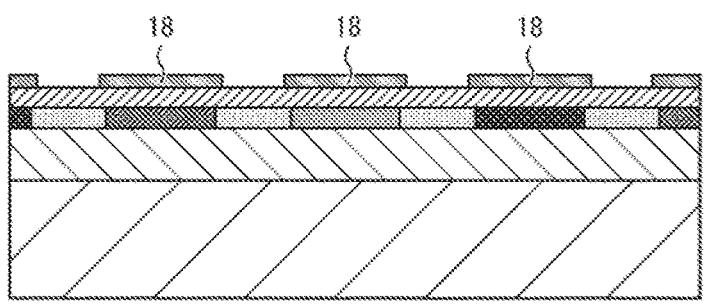

Next, as illustrated in FIG. 22B, the P-electrode layer 18 is deposited on the first P-side layer 13d, and is patterned so as to cover the light-emitting layer 12d of each micro LED 100d (electrode layer forming step). Since the first P-side layer 13d is thin and has a high-resistance, the spread of the current in the horizontal direction by the first P-side layer 13d is very small. For that reason, it is desirable that the P-electrode layer 18 is formed wider than the light-emitting layer 12d, and the P-electrode layer 18 completely covers the light-emitting layer 12d. In other words, each light-emitting layer is desirably covered with the P-electrode layer 18 in plan view.

Figure 22C:
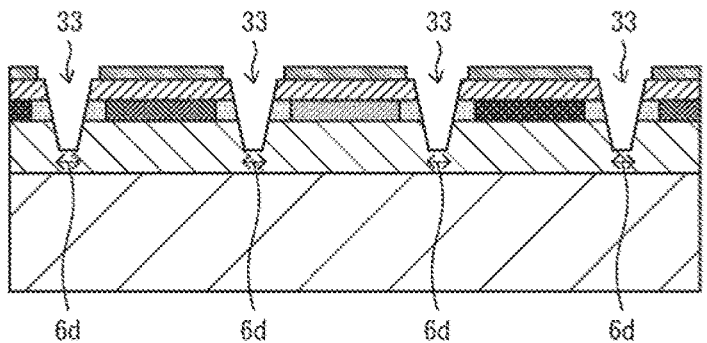

As illustrated in FIG. 22C, a separation groove 33 is formed at the position of the micro LED separation region 6d for separating the micro LEDs 100d. It is desirable that the separation groove 33 is formed deeply so that a residual region of the first N-side layer 11d is minimized. As illustrated in FIG. 22C, the separation groove 33 is desirably provided at a position separated by a fixed distance from the light-emitting layer 12d. This distance is desirably set to be equal to a range in which damage occurs during formation of the separation groove 33, and in a normal dry etching technique, the distance from the light-emitting layer 12d to the side wall of the separation groove 33 is desirably 300 nm to 1000 nm. In FIG. 22C, the side walls of the separation groove 33 are inclined in a forward taper so as to open upward from the growth substrate 10, and when the light emission direction is on the growth substrate 10 side, an effect of improving light-output efficiency can be obtained. However, when the light emission direction is opposite to the growth substrate 10 side with respect to the nitride semiconductor layer 20d, the light-output efficiency decreases, and thus it is desirable that the side walls of the separation groove 33 are perpendicular to the growth substrate 10 or have a reverse taper.

Figure 23A:
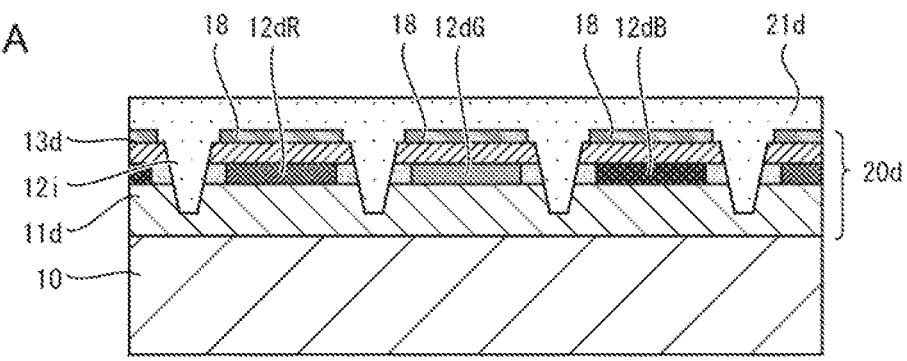
FIGS. 23A to 23C are a continuation of FIG. 22 and are cross-sectional views illustrating the example of the manufacturing method of the micro LED.

Next, as illustrated in FIG. 23A, a protection film 21d is formed. It is desirable that the protection film 21d fills the separation groove 33, covers the P-electrode layer 18, and flattens the surface.

Figure 23B:
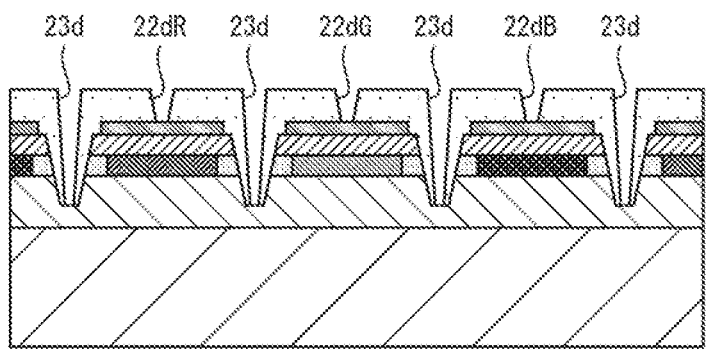
Figure 23C:
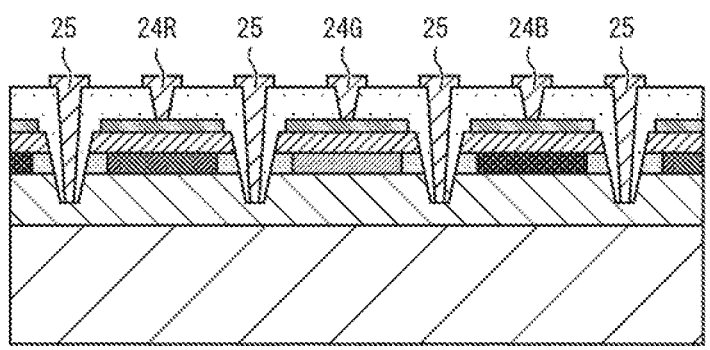

Next, as illustrated in FIG. 23B, the P-contact hole 22d for the P-electrode 13 opened above the P-electrode layer 18 and an N-contact hole 23d for the N-electrode is opened in the separation groove 33. Furthermore, as illustrated in FIG. 23C, the P-electrode 24 and the N-electrode 25 are formed. The bonding process with the drive circuit substrate 50 is the same as in Embodiment 1.

As described above, by selectively doping a rare earth element which is a light-emitting element, each micro LED 100d can realize a configuration that does not include anything other than its own light-emitting layer 12d. By separating the nitride semiconductor layer 20d of each micro LED 100d, a decrease in light emission efficiency and color mixing can be reduced to the extent that a problem is not caused. Furthermore, with such a configuration, the structure of the nitride semiconductor layer 20d can be made simple and thin. Also, the manufacturing process can be simplified.

In the manufacturing process of Embodiment 6, for the selective doping of the light-emitting layer 12d with the rare earth element, an ion implantation method is used, but a diffusion method may also be used. That is, a $SiO_2$ film containing a rare earth element serving as a diffusion source is deposited on the position where each light-emitting layer 12d is formed in the high-resistance layer 12i, and thermally diffused. Alternatively, the light-emitting layer 12d can be formed by providing a diffusion mask (such as a silicon nitride film) having an opening above the position where each light-emitting layer 12d is formed and causing the diffusion mask to be subjected to gas-phase diffusion. In the case of the diffusion method, it is demanded to deposit the first P-side layer 13d after forming each light-emitting layer 12d.

SUMMARIZATION

A micro light-emitting diode (micro LED 1) according to Aspect 1 of the present disclosure includes a first micro light-emitting diode (blue light-emitting micro LED 100B) including a first light-emitting layer (blue light-emitting layer 12B) that emits light of a first wavelength and emitting light at the first wavelength, and a second micro light-emitting diode (green light-emitting micro LED 100G) including the first light-emitting layer and a second light-emitting layer (green light-emitting layer 12G) that emits light of a second wavelength longer than the first wavelength, and emitting light at the second wavelength, in which the first micro light-emitting diode and the second micro light-emitting diode are both made of a nitride semiconductor (nitride semiconductor layer 20), the second light-emitting layer is a nitride semiconductor layer doped with a second rare earth element, and the nitride semiconductor of the first micro light-emitting diode and the nitride semiconductor of the second micro light-emitting diode are separated from each other.

According to the configuration described above, since the second light-emitting layer is formed of the nitride semiconductor layer doped with the rare earth element, different compound semiconductors do not have to be used for forming each light-emitting layer, and the process can be simplified. Since the nitride semiconductor of the first micro light-emitting diode and the nitride semiconductor of the second micro light-emitting diode are separated from each other, it is possible to suppress that light emission of each micro light-emitting diode leaks to other micro light-emitting diodes and color mixing occurs. As a result, it is possible to realize a micro light-emitting diode in which light-emitting devices having different light emission wavelengths can be integrated by a simpler process without going through a complicated process using a heterogeneous compound semiconductor.

Aspect 2 of the present disclosure provides the micro light-emitting diode (micro LED 1) according to Aspect 1, which may further include a third micro light-emitting diode (red light-emitting micro LED 100R) including the first light-emitting layer (blue light-emitting layer 12B), the second light-emitting layer (green light-emitting layer 12G), and a third light-emitting layer (red light-emitting layer 12R) that emits light of a third wavelength longer than the second wavelength, and emitting light at the third wavelength, and in which the third micro light-emitting diode may be made of a nitride semiconductor (nitride semiconductor layer 20), the third light-emitting layer may be a nitride semiconductor layer doped with a third rare earth element, and the nitride semiconductor of the first micro light-emitting diode, the nitride semiconductor of the second micro light-emitting diode, and the nitride semiconductor of the third micro light-emitting diode may be separated from each other.

According to the configuration described above, a micro LED that emits three primary colors of red, green, and blue can be realized by a simpler process, and a full color display element can be manufactured at low cost.

Aspect 3 of the present disclosure provides the micro light-emitting diode (micro LED 1_0) according to Aspect 1 or 2, which may further include a dummy structure (101) adjacent to the first micro light-emitting diode (blue light-emitting micro LED 100B) and having the same thickness as the second micro light-emitting diode (green light-emitting micro LED 100G). According to the configuration described above, in the manufacturing process, the first micro light-emitting diode and the second micro light-emitting diode can have the same thickness.

Aspect 4 of the present disclosure provides the micro light-emitting diode (micro LED 1) according to Aspect 2, which may further include a dummy structure (101) adjacent to the first micro light-emitting diode (blue light-emitting micro LED 100B) and having the same thickness as the third micro light-emitting diode (red light-emitting micro LED 100R). According to the configuration described above, in the manufacturing process, the first micro light-emitting diode and the third micro light-emitting diode can have the same thickness.

Aspect 5 of the present disclosure provides the micro light-emitting diode (micro LED 1) according to any one of Aspects 1 to 4 described above, in which side walls of the first light-emitting layer (blue light-emitting layer 12B) and the second light-emitting layer (green light-emitting layer 12G) may be covered with a high-resistance nitride semiconductor layer (side wall high-resistance layer 35). According to the configuration described above, damage during dry etching of the light-emitting layer in the manufacturing process can be recovered.

Aspect 6 of the present disclosure provides the micro light-emitting diode (micro LED 1) according to Aspect 2 described above, in which side walls of the first light-emitting layer (blue light-emitting layer 12B), the second light-emitting layer (green light-emitting layer 12G), and the third light-emitting layer (red light-emitting layer 12R) may be covered with a high-resistance nitride semiconductor layer (side wall high-resistance layer 35). According to the configuration described above, in a micro LED that emits three primary colors of red, green, and blue, damage during dry etching of the light-emitting layer in the manufacturing process can be recovered.

Aspect 7 of the present disclosure provides the micro light-emitting diode (micro LED 1) according to any one of Aspects 1 to 6 described above, in which the first light-emitting layer (blue light-emitting layer 12B) may be a nitride semiconductor layer doped with a first rare earth element. According to the configuration described above, in a micro LED that emits three primary colors of red, green, and blue, all light-emitting layers can be formed of a nitride semiconductor layer doped with a rare earth element.

Aspect 8 of the present disclosure provides the micro light-emitting diode (micro LED 1_A) according to any one of Aspects 1 to 7 described above, in which the first light-emitting layer (blue light-emitting layer 12B) may have a multiple-quantum well structure composed of the nitride semiconductor layer. According to the configuration described above, light emission with high efficiency and high output can be realized in the first light-emitting layer.

A micro light-emitting diode (micro LED 1_D) according to Aspect 9 of the present disclosure includes a first micro light-emitting diode (blue light-emitting micro LED 100dB) that includes a first light-emitting layer (blue light-emitting layer 12dB) containing a first rare earth element and emits light at a first wavelength, and a second micro light-emitting diode (green light-emitting micro LED 100dG) that includes a second light-emitting layer (green light-emitting layer 12dG) containing a second rare earth element and emits light at a second wavelength longer than the first wavelength, in which the first micro light-emitting diode and the second micro light-emitting diode are both made of a nitride semiconductor (nitride semiconductor layer 20d), and the first light-emitting layer and the second light-emitting layer are both covered with an electrode layer (P-electrode layer 18) in plan view.

According to the configuration described above, since each light-emitting layer is formed of a rare earth element, different kind of compound semiconductors do not have to be used for forming the light-emitting layer, and the process can be simplified. Each micro light-emitting diode has a configuration including only its own light-emitting layer, and it is possible to suppress that each light emission leaks to other micro light-emitting diodes and color mixing occurs. Since both the first light-emitting layer and the second light-emitting layer are covered with the electrode layer in plan view, a decrease in current flow due to resistance can be suppressed. As a result, it is possible to realize a micro light-emitting diode in which light-emitting devices having different light emission wavelengths can be integrated by a simpler process without going through a complicated process using a heterogeneous compound semiconductor.

Aspect 10 of the present disclosure provides the micro light-emitting diode (micro LED 1_D) according to Aspect 9 described above, in which the first light-emitting layer (blue light-emitting layer 12dB) and the second light-emitting layer (green light-emitting layer 12dG) may be spaced apart by a separation groove (33). According to the configuration described above, it is possible to reduce a decrease in light emission efficiency and color mixing.

Aspect 11 of the present disclosure provides the micro light-emitting diode (micro LED 1_D) according to Aspect 10 described above, in which a high-resistance nitride semiconductor layer (high-resistance layer 12i) is present between the first light-emitting layer (blue light-emitting layer 12dB) and a side wall of the separation groove (33) and between the second light-emitting layer (green light-emitting layer 12dG) and a side wall of the separation groove. According to the configuration described above, it is possible to reduce damage during formation of the separation groove.

Aspect 12 of the present disclosure provides the micro light-emitting diode (micro LED 1_D) according to any one of Aspects 9 to 11 described above, which may further include a third micro light-emitting diode (red light-emitting micro LED 100dR) that includes a third light-emitting layer (red light-emitting layer 12dR) containing a third rare earth element and emits light at a third wavelength longer than the second wavelength, and in which the third micro light-emitting diode may be made of a nitride semiconductor (nitride semiconductor layer 20d), and the third light-emitting layer may be covered with an electrode layer (P-electrode layer 18) in plan view. According to the configuration described above, a micro LED that emits three primary colors of red, green, and blue can be realized by a simpler process, and a full color display element can be manufactured at low cost.

A manufacturing method of a micro light-emitting diode (micro LED 1) according to Aspect 13 of the present disclosure includes forming a nitride semiconductor layer (nitride semiconductor layer 20) including a first light-emitting layer (blue light-emitting layer 12B) that emits light of a first wavelength and a second light-emitting layer (green light-emitting layer 12G) that is formed by doping a second rare earth element and emits light of a second wavelength longer than the first wavelength, and separating the nitride semiconductor layer formed in the forming the nitride semiconductor layer into a first micro light-emitting diode (blue light-emitting micro LED 100B) that includes the first light-emitting layer and emits light at the first wavelength and a second micro light-emitting diode (green light-emitting micro LED 100G) that includes the first light-emitting layer and the second light-emitting layer and emits light at the second wavelength. According to the configuration described above, the same effect as in Aspect 1 is exhibited.

A manufacturing method of a micro light-emitting diode (micro LED 1) according to Aspect 14 of the present disclosure includes forming a first micro light-emitting diode (blue light-emitting micro LED 100dB) that includes a first light-emitting layer (blue light-emitting layer 12dB) containing a first rare earth element and emits light at a first wavelength with a nitride semiconductor (nitride semiconductor layer 20d), forming a second micro light-emitting diode (green light-emitting micro LED 100dG) that includes a second light-emitting layer (green light-emitting layer 12dG) containing a second rare earth element and emits light at a second wavelength longer than the first wavelength with a nitride semiconductor, and covering the first light-emitting layer and the second light-emitting layer with an electrode layer (P-electrode layer 18) in plan view. According to the configuration described above, the same effect as in Aspect 9 is exhibited.

The present disclosure is not limited to the embodiments described above, various modifications may be made thereto within the scope set forth in the claims, and embodiments obtained by appropriately combining technical means disclosed in different embodiments are also included in the technical scope of the present disclosure. Furthermore, new technical features can be formed by combining the technical means disclosed in the respective embodiments.

The present disclosure contains subject matter related to that disclosed in U.S. Provisional Patent Application No. 62/808,097 filed in the US Patent Office on Feb. 20, 2019, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A micro light-emitting diode comprising:
a first micro light-emitting diode including a first light-emitting layer that emits light of a first wavelength; and
a second micro light-emitting diode including the first light-emitting layer and a second light-emitting layer that emits light of a second wavelength longer than the first wavelength,
wherein:
the first micro light-emitting diode and the second micro light-emitting diode are both made of a nitride semiconductor;
the second light-emitting layer is a nitride semiconductor layer doped with a first rare earth element; and
the nitride semiconductor of the first micro light-emitting diode and the nitride semiconductor of the second micro light-emitting diode are separated from each other;
wherein side walls of the first light-emitting layer and the second light-emitting layer are covered with a high-resistance nitride semiconductor layer.

2. A micro light-emitting diode comprising:
a first micro light-emitting diode including a first light-emitting layer that emits light of a first wavelength; and
a second micro light-emitting diode including the first light-emitting layer and a second light-emitting layer that emits light of a second wavelength longer than the first wavelength,
wherein:
the first micro light-emitting diode and the second micro light-emitting diode are both made of a nitride semiconductor;
the second light-emitting layer is a nitride semiconductor layer doped with a first rare earth element; and
the nitride semiconductor of the first micro light-emitting diode and the nitride semiconductor of the second micro light-emitting diode are separated from each other;
wherein the first light-emitting layer is a nitride semiconductor layer doped with a second rare earth element.

3. A micro light-emitting diode comprising:
a first micro light-emitting diode that includes a first light-emitting layer containing a first rare earth element and emits light at a first wavelength; and
a second micro light-emitting diode that includes a second light-emitting layer containing a second rare earth element and emits light at a second wavelength longer than the first wavelength,
wherein the first micro light-emitting diode and the second micro light-emitting diode are both made of a nitride semiconductor, and
the first light-emitting layer and the second light-emitting layer are both covered with an electrode layer in a plan view.

4. The micro light-emitting diode according to claim 3, wherein the first light-emitting layer and the second light-emitting layer are spaced apart by a separation groove.

5. The micro light-emitting diode according to claim 4, wherein a high-resistance nitride semiconductor layer is between the first light-emitting layer and a side wall of the separation groove and between the second light-emitting layer and a side wall of the separation groove.

6. The micro light-emitting diode according to claim 3, further comprising:
a third micro light-emitting diode that includes a third light-emitting layer containing a third rare earth element and emits light at a third wavelength longer than the second wavelength,
wherein the third micro light-emitting diode is made of a nitride semiconductor, and the third light-emitting layer is covered with an electrode layer in a plan view.

7. A manufacturing method of a micro light-emitting diode comprising:
forming a nitride semiconductor layer including a first light-emitting layer that emits light of a first wavelength;
forming a second light-emitting layer by doping a first rare earth element, the second light-emitting layer emitting light of a second wavelength longer than the first wavelength; and
separating the nitride semiconductor layer into a first micro light-emitting diode that includes the first light-emitting layer and emits light at the first wavelength and a second micro light-emitting diode that includes the first light-emitting layer and the second light-emitting layer and emits light at the second wavelength.

8. A manufacturing method of a micro light-emitting diode comprising:
forming a first micro light-emitting diode that includes a first light-emitting layer containing a first rare earth element and emits light at a first wavelength, the first micro light-emitting diode formed with a nitride semiconductor;

forming a second micro light-emitting diode that includes a second light-emitting layer containing a second rare earth element and emits light at a second wavelength longer than the first wavelength, the second micro light-emitting diode formed with a nitride semiconductor; and covering the first light-emitting layer and the second light-emitting layer with an electrode layer in a plan view.

\* \* \* \* \*